United States Patent
Saito et al.

(10) Patent No.: US 6,180,320 B1
(45) Date of Patent: Jan. 30, 2001

(54) METHOD OF MANUFACTURING A SEMICONDUCTOR DEVICE HAVING A FINE PATTERN, AND SEMICONDUCTOR DEVICE MANUFACTURED THEREBY

(75) Inventors: Takayuki Saito; Takeo Ishibashi; Toshiyuki Toyoshima; Kanji Sugino; Naoki Yasuda; Tadashi Miyagi, all of Tokyo (JP)

(73) Assignee: Mitsubishi Denki Kabushiki Kaisha, Tokyo (JP)

(*) Notice: Under 35 U.S.C. 154(b), the term of this patent shall be extended for 0 days.

(21) Appl. No.: 09/371,499

(22) Filed: Aug. 10, 1999

Related U.S. Application Data

(63) Continuation-in-part of application No. 09/175,734, filed on Oct. 20, 1998.

(30) Foreign Application Priority Data

| Mar. 9, 1998 | (JP) | 10-056686 |
| May 13, 1998 | (JP) | 10-130052 |
| Mar. 9, 1999 | (JP) | 11-062047 |

(51) Int. Cl.[7] ............... G03F 7/039; G03F 7/30; G03F 7/38
(52) U.S. Cl. ............ 430/311; 430/203; 430/313; 430/328; 430/329; 430/330
(58) Field of Search .................. 430/311, 328, 430/329, 330, 313

(56) References Cited

U.S. PATENT DOCUMENTS

| Re. 35,821 | * | 6/1998 | Niki et al. | 430/330 |
| 5,670,299 | | 9/1997 | Urano et al. | 430/330 |
| 6,054,254 | * | 4/2000 | Sato et al. | 430/328 |

FOREIGN PATENT DOCUMENTS

| 4-139826 | 5/1992 | (JP) . |
| 8-6256 | 1/1996 | (JP) . |

* cited by examiner

*Primary Examiner*—Richard L. Schilling
(74) *Attorney, Agent, or Firm*—McDermott, Will & Emery

(57) ABSTRACT

There is described a method of stably manufacturing a fine resist pattern narrower than the wavelength of exposing light from a stepper. Under the method, a resist pattern is formed on a semiconductor substrate through use of an acid catalyst chemically-amplified photoresist, and an organic film which includes an acid or which produces an acid on exposure to light is formed on the surface of the semiconductor substrate including the resist pattern. The organic film is then subjected to a heat treatment to thereby diffuse an acid. The surface layer of the resist pattern is made soluble in an alkaline developer, and the surface layer of the resist pattern is removed through use of the alkaline developer. As a result, a fine resist pattern is formed.

17 Claims, 12 Drawing Sheets

FIG. 1 (a)
FIG. 1 (b)
step 1
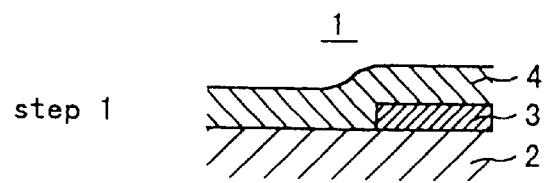
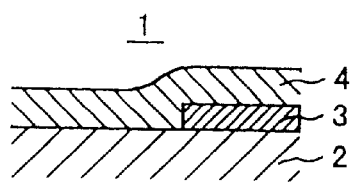
step 2
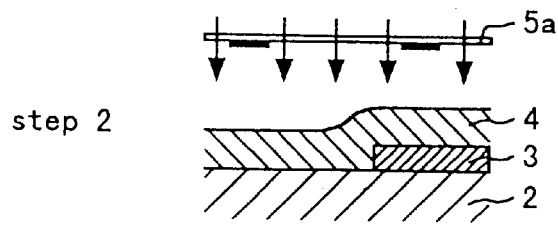
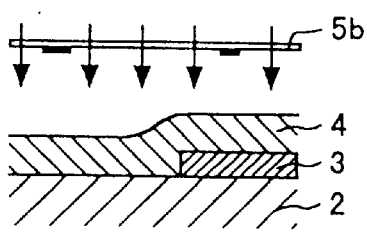
step 3
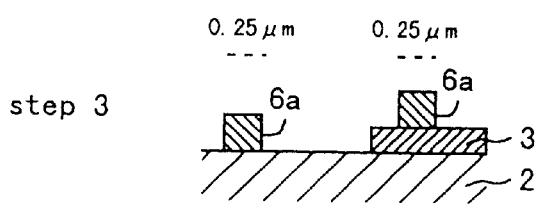
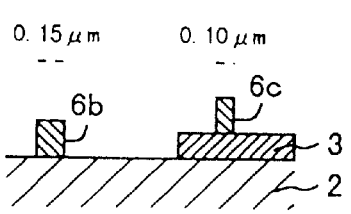
step 4
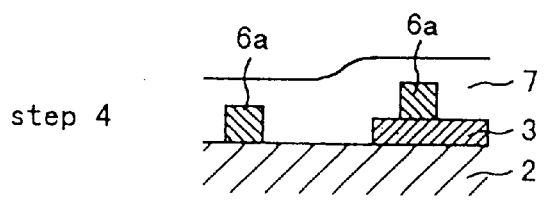
step 5
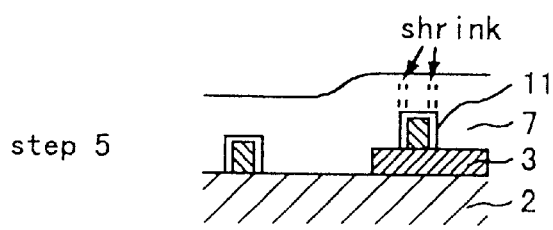
step 6
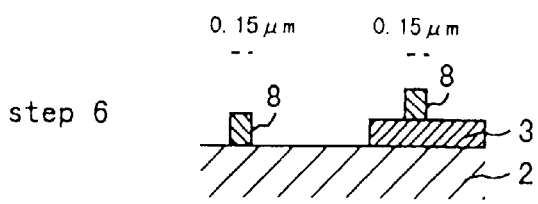

FIG. 2 (a)
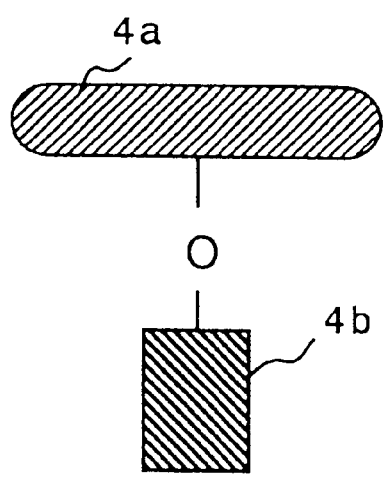
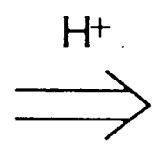
FIG. 2 (b)
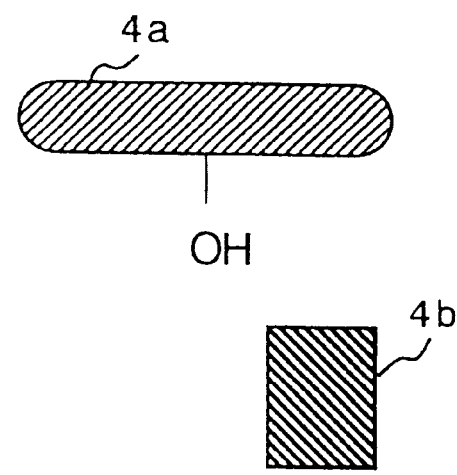

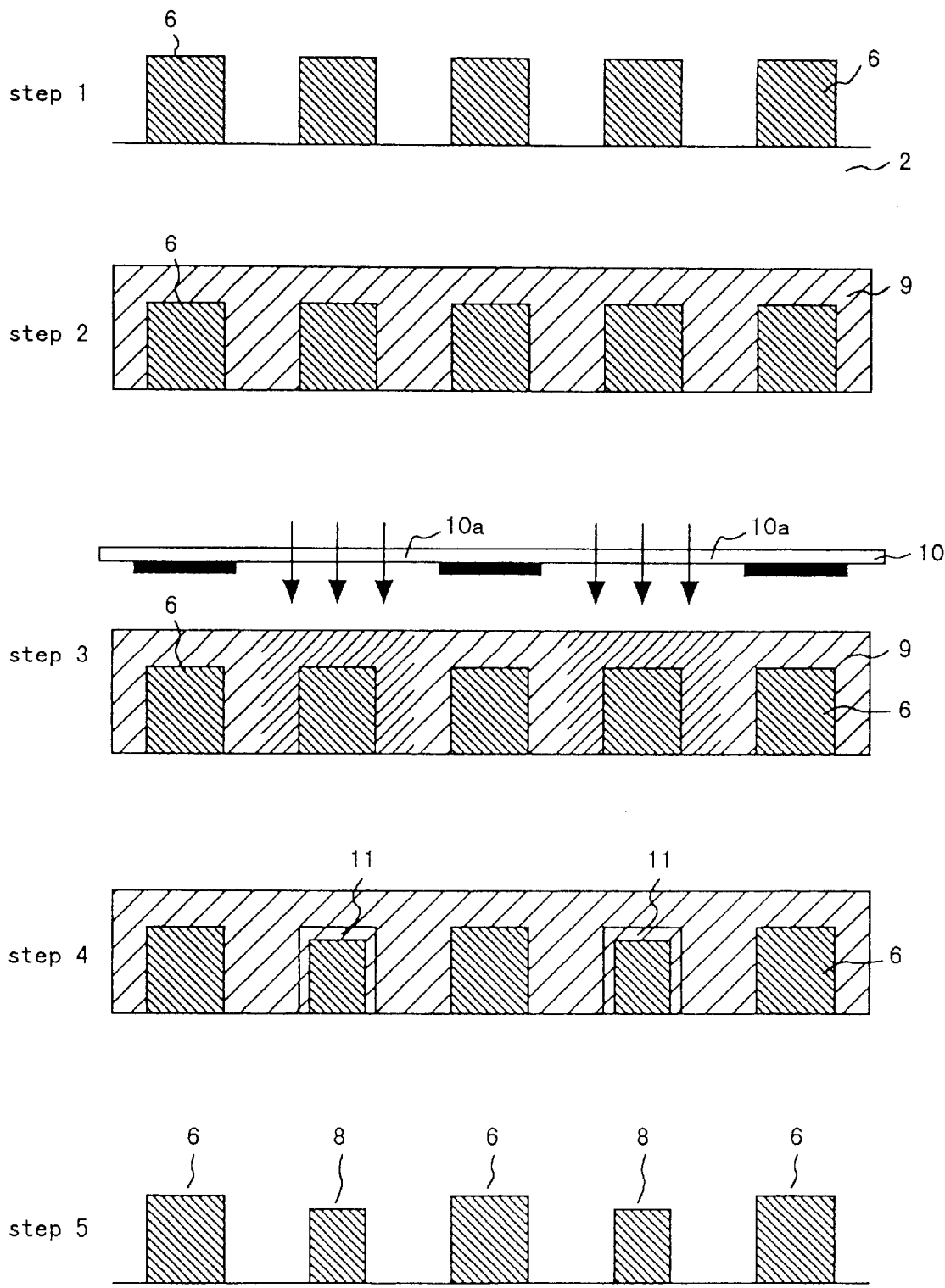

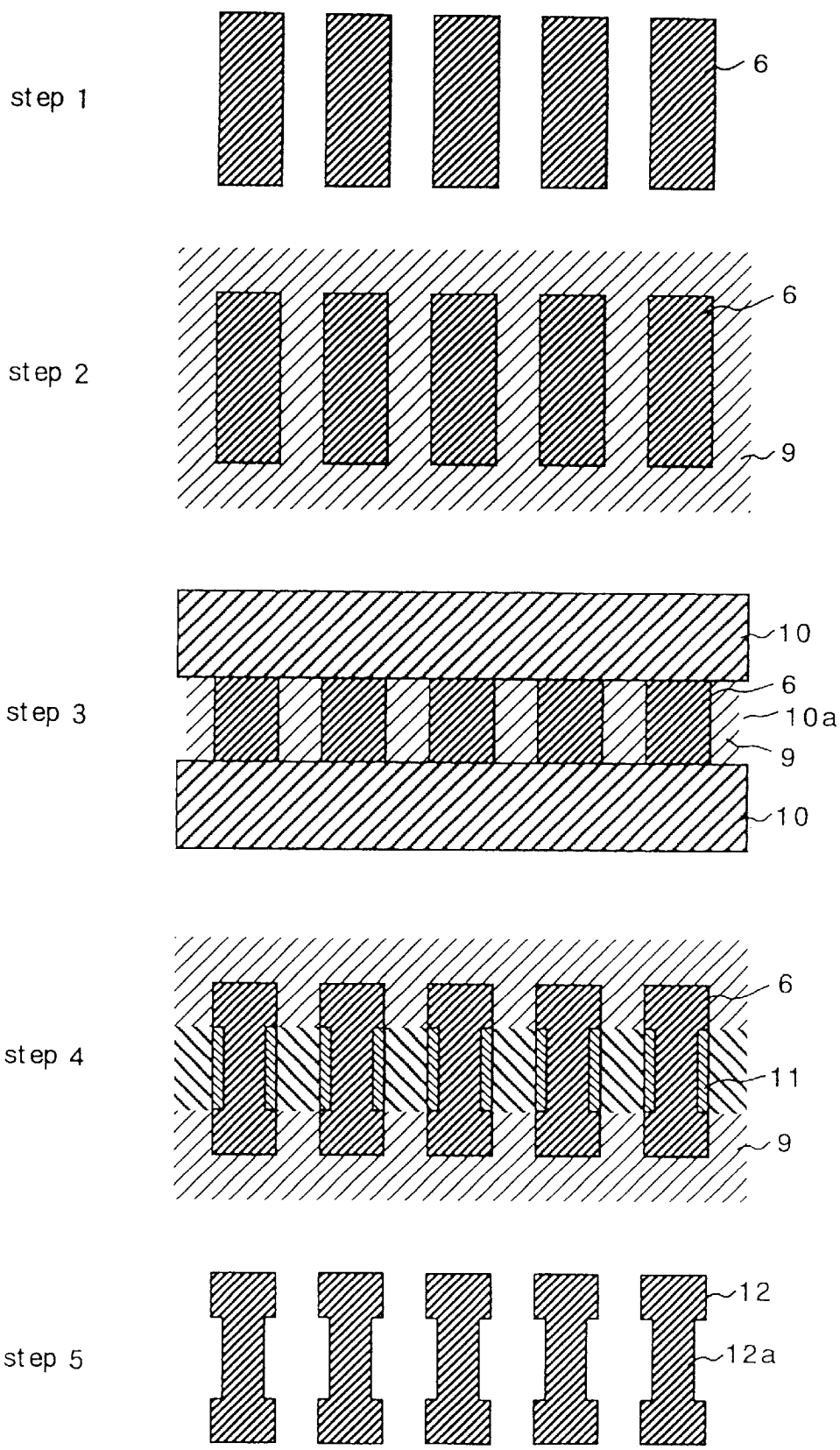

step 1 step 2~3 step 4

FIG.10
step 1
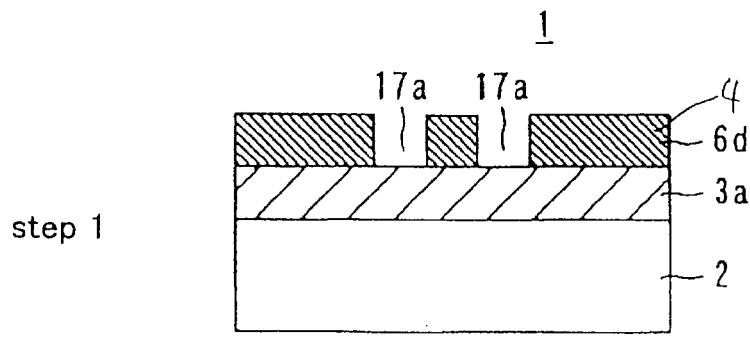
step 2
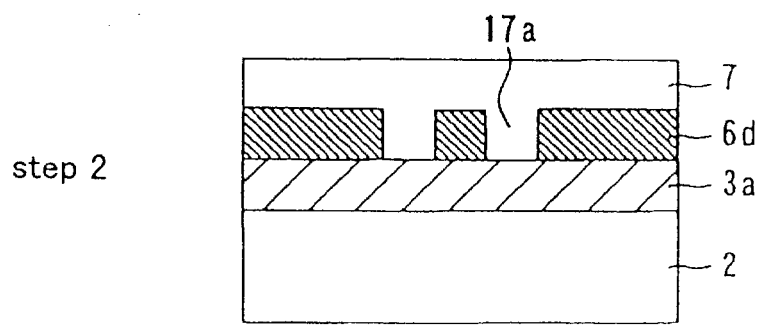
step 3
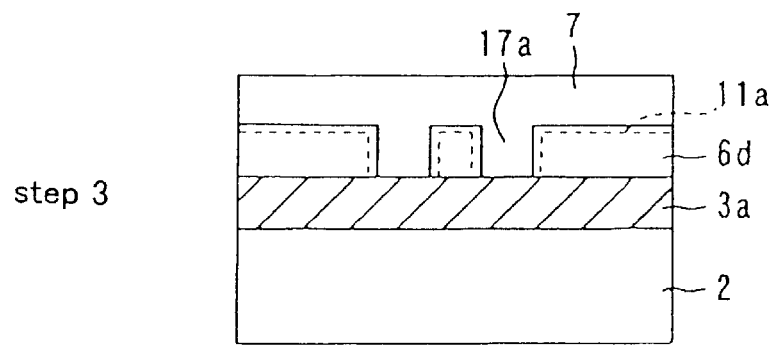
step 4
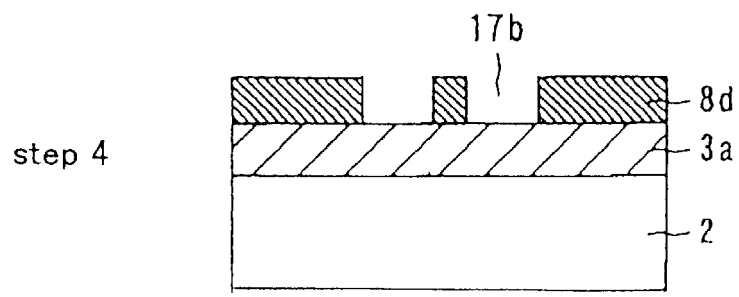

PRIOR ART

METHOD OF MANUFACTURING A SEMICONDUCTOR DEVICE HAVING A FINE PATTERN, AND SEMICONDUCTOR DEVICE MANUFACTURED THEREBY

RELATED APPLICATIONS

This application claims priority from and is a Continuation-in-Part of co-pending application Ser. No. 09/175,734, filed Oct. 20, 1998, now pending.

BACKGROUND OF THE INVENTION

1. Field of the Invention

The present invention relates to a method of manufacturing a semiconductor device having fine patterns and a semiconductor device manufactured by the method. More particularly, the present invention relates to a method of forming a resist pattern used for micro-processing of an LSI semiconductor element, a liquid crystal display panel, or the like. Further specifically, the present invention relates to a method of forming a highly-accurate fine resist pattern.

2. Background Art

FIG. 14 shows resist patterns which are formed on an underlying layer 21 according to a conventional method by exposing the layer to light through a mask held at an optimum focal point by a stepper. In FIG. 14, reference numeral 22 designates a resist pattern having a line width broader than the wavelength of exposing light from the light source of the stepper, and 23 designates a fine resist pattern having a line width narrower than the wavelength of exposing light from the light source of the stepper. As mentioned above, in a case where the underlying layer is exposed to light through the mask held at an optimum focal point, even the existing method enables a resist pattern to be formed substantially faithfully.

FIG. 15 shows resist patterns which are formed on the underlying layer 21 according to the existing method by exposing the layer to light through a mask held out of focus. In FIG. 15, reference numeral 22' designates a resist pattern having a line width broader than the wavelength of exposing light from the light source of the stepper, and reference numeral 23' designates a fine resist pattern having a line width narrower than the wavelength of exposing light from the light source of the stepper. In a case where the underlying layer is exposed to light through the mask held out of focus, no problems are encountered in the formation of the resist pattern 22' having a line width broader than the wavelength of exposing light from the light source of the stepper. In contrast, in a case where the fine resist pattern 23' having a line width narrower than the wavelength of exposing light from the light source is formed, there arises a problem that the line width of a resultant pattern becomes narrower.

FIG. 16 is a plot showing the relationship between the dimension of the resist pattern and defocus for the purpose of explaining the foregoing problem. As designated by line 22a shown in FIG. 16, in a case where a resist pattern of great size is formed, no dimensional variations arise even if the mask of the stepper is slightly defocused. In contrast, as designated by curved line 23a shown in FIG. 16, in a case where a fine resist pattern smaller than the wavelength of exposing light from the light source of the stepper is formed, and if the mask of the stepper is defocused, significant dimensional variations arise, resulting in a resist pattern of undesirable size.

As mentioned above, at the time of formation of a fine resist pattern, the existing photolithography technique has the disadvantage of being incapable of stably forming a resist pattern.

Accordingly, the object of the present invention is to stably form a fine resist pattern smaller than the limit of the wavelength of exposing light by processing photoresist through a chemical mechanism such as diffusion of an acid or decomposition of photoresist.

Another object of the present invention is to provide a method of manufacturing a semiconductor device which uses the thus-formed fine resist pattern, as well as a semiconductor device having the fine pattern manufactured by the method.

SUMMARY OF THE INVENTION

According to one aspect of the present invention, in a method of manufacturing a semiconductor, a resist pattern is formed on a semiconductor underlying layer disposed on a semiconductor substrate through use of an acid catalyst chemically-amplified photoresist. An organic film organic film containing an acid component or a base component is formed on the surface of the semiconductor underlying layer including the resist pattern. The organic film is thermally-treated to diffuse the acidic component or the base component thereby rendering the surface layer of the resist pattern soluble in an alkaline developer. And, the thermally-treated organic film and the surface layer of the resist pattern is removed through use of the alkaline developer thereby reducing the resist pattern.

In the method, an acidic polymer or a base polymer may be preferably used to form the organic film containing the acidic component or the base component.

In another aspect of the present invention, in the semiconductor device manufacturing method, a polymer having an acidic component added thereto may be used as the organic film containing the acidic component. Alternatively, a polymer having an base component added thereto may be used as the organic film containing the base component.

According to another aspect of the present invention, in a method of manufacturing a semiconductor device, a resist pattern is formed on a semiconductor underlying layer disposed on a semiconductor substrate through use of an acid catalyst chemically-amplified photoresist. An organic film, which produces an acid or a base on exposure to light, is formed on the surface of the semiconductor underlying layer including the resist pattern. The organic film is exposed to light to produce an acid therein. The organic film is thermally-treated to diffuse the acid or the base thereby rendering the surface layer of the resist pattern soluble in an alkaline developer. And, the organic film and the surface layer of the resist pattern is removed through use of the alkaline developer thereby reducing the resist pattern.

In another aspect, in the method, the organic film which produces an acid or a base on exposure to light may be formed preferably by addition of an photosensitive acid generator or a photosensitive base generator to a polymer.

Other and further objects, features and advantages of the invention will appear more fully from the following description.

BRIEF DESCRIPTION OF THE DRAWINGS

FIGS. 1(a) and 1(b) are schematic representations for explaining a method of manufacturing a semiconductor device according to a first embodiment of the present invention, more particularly a method of forming a fine resist pattern in comparison with an existing method;

FIGS. 2(a) and 2(b) are diagrammatic representations showing linkage between a base resin and a protecting group of a chemically-amplified positive resist for use with an excimer laser beam, as well as disconnection of the linkage;

FIG. 3 is a diagrammatic representation for explaining a method of manufacturing a semiconductor device according to a second embodiment of the present invention, more specifically a fragmentary cross-sectional view for explaining steps of a method of forming a resist pattern;

FIG. 4 is a diagrammatic representation for explaining a method of manufacturing a semiconductor device according to a third embodiment of the present invention, more specifically a fragmentary cross-sectional view for explaining steps of a method of forming a fine resist pattern;

FIGS. 8 through 10 show a method of forming a minute resist pattern according to a fourth embodiment of the present invention.

DETAILED DESCRIPTION OF THE PREFERRED EMBODIMENTS

Figure 5A:
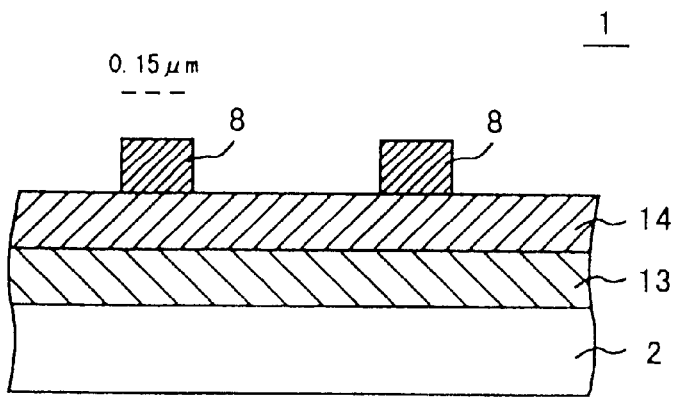
FIGS. 5(a) and 5(b) are schematic representations showing a method of manufacturing a semiconductor device according to the embodiments of the present invention.

Preferred embodiments of the present invention will be described in detail hereinbelow with reference to the accompanying drawings.

First Embodiment

FIGS. 1(a) and 1(b) are schematic representations for explaining a method of manufacturing a semiconductor device according to a first embodiment of the present invention, more particularly a method of forming a fine resist pattern in comparison with an existing method.

FIG. 1(a) comprises fragmentary cross-sectional views showing a series of steps for formation of a resist pattern according to the first embodiment, and FIG. 1(b) comprises fragmentary cross-sectional views showing a series of steps for formation of a resist pattern by conventional photolithography.

First, as shown in step 1, a semiconductor substrate 2 having a step 3 formed thereon is used as a wafer 1. A chemically-amplified positive resist 4 for use with an Excimer laser beam is applied onto the semiconductor substrate 2 including the step 3 to a thickness of 3,000 to 20,000 Å.

Before the positive resist 4 is applied to the wafer 1, the surface of the wafer 1 may be treated with hexamethyldisilazane or the like, thus strengthening adhesion between the resist 4 and the wafer 1. Further, an upper layer material may be applied on the resist 4. Still further, the thus-coated resist 4 may be subjected to heat treatment.

In step 2, according to the first embodiment shown in FIG. 1(a) the positive resist 4 is selectively exposed to light through a mask 5a adjusted so as to produce a line width of 0.25 μm (or a line width of 1.25 μm in a case where a pattern is imaged on the resist on a scale of 1:5).

In contrast, according to the conventional method shown in FIG. 1(b), the positive resist 4 is selectively exposed to light through a mask 5b adjusted so as to produce a line width of 0.15 μm (or a line width of 0.75 μm in a case where a pattern is imaged on the resist on a scale of 1:5).

In step 3, the thus-exposed resist patterns are developed. Suppose the positive resist is exposed to light in step 2 while the stepper is focused on a lower portion of the step 3 of the semiconductor substrate 1. According to the first embodiment shown in FIG. 1(a), since the mask pattern has a significant size, resist patterns having a size of 0.25 μm are formed on the step 3 and on the semiconductor substrate 2 below the step 3, respectively.

In contrast, under the conventional method shown in FIG. 1(b), a resist pattern having a size of 0.15 μm is formed below the step 3 or on the semiconductor substrate 2, and a resist pattern having a size of 0.10 μm is formed on the step 3. Thus, variations arise in the line width of the resist patterns.

In step 4, according to the first embodiment, resin made of a polyacrylic acid is applied onto the wafer 1 as an organic film 7 which contains an acidic component.

In step 5, the organic film 7 formed over the wafer 1 is subjected to a heat treatment at 120° C. for 60 seconds while the wafer 1 is loaded on a hot plate (not shown). This is intended to diffuse the acid over the surface layer of the resist pattern 6 by heating the organic film 7, thus rendering the surface layer of the resist pattern 6 soluble in an alkaline developer. Accordingly, a layer 11 that has been made soluble (hereinafter simply referred to as a solubilized layer) is formed along the surface of the resist pattern 6.

As shown in step 6, when the resist pattern is developed with the alkaline developer, the surface layer of the resist pattern 6 is dissolved, and the resist pattern shrinks 0.10 μm in line width. As a result, a resist pattern 8 having a line width of 0.15 μm is produced.

In step 5, if the temperature of the heat treatment is increased, or the time required for heat treatment is increased, then the amount of resist pattern dissolved by development in step 6 will increase, resulting in an increase in the amount of shrinkage of the line width.

According to the first embodiment, an acidic polymer can be used as the organic film 7 which contains an acidic component. More specifically, a base polymer which is acidic in itself is used as the organic film 7.

Preferably, for example, an polyacrylic acid or a polyvinyl sulfuric acid can be used as the acidic polymer.

Further, a polymer having an acidic component added thereto can be used as the organic film containing an acidic component. More specifically, a base polymer which has neutrality and has an acidic component added thereto is used as the organic film.

Preferably, for example, the polymer can be selected from the group consisting of polyvinyl alcohol, a polyacrylic acid, polyvinyl pyrrolidone, polyvinyl amine, and polyvinyl acetal.

Further preferably, an acidic component added to such a polymer can be selected from the group consisting of an alkyl carboxylic acid, an alkyl sulfuric acid, and a salicylic acid.

Preferably, a solution used for forming the organic film 7 may be pure water or a mixed solution which is composed of pure water and an organic solvent to such an extent as not to dissolve the resist pattern.

The film forming characteristics of the organic film 7 can be improved, or the diffusion length of an acid in the organic film 7 can be retarded, by addition of an organic base component, such as tetramethylammoniumhydroxide, ethanol amine, or ammonium, to the organic film 7.

Preferably, the organic base component can be selected from the group consisting of tetramethylammoniumhydroxide, ethanol amine, and ammonium.

The coating characteristics of the organic film 7 can be improved by addition of a surfactant to the organic film 7.

Preferably, an alkaline solution containing 1 to 5 wt. % of tetramethylammoniumhydroxide or this alkaline solution having 10 wt. % or less of alcohol added thereto is used as the alkaline developer.

Next, the mechanism of rendering the surface layer of the resist pattern 6 soluble in the alkaline developer by thermally treating the organic film 7 will be described hereunder.

As diagrammatically shown in FIG. 2A, in a chemically-amplified positive resist for use with an Excimer laser beam, a base resin 4a is linked to a protecting group 4b, thus rendering the resist undissolvable in an alkaline solution. As shown in FIG. 2(b), when the acid produced by thermally treating the organic film acts on the resist, the linkage between the base resin 4a and the protecting group 4b is separated, thus rendering the resist dissolvable in an alkaline solution. Accordingly, only the surface layer of the acidly-processed resist pattern becomes dissolvable in an alkaline solution. The surface layer of the resist pattern is dissolved by treating the resist pattern with an alkaline developer, enabling the resist patterns (i.e., residual resist portions) to be shrunk.

As mentioned previously, according to the first embodiment, a resist pattern is formed on a semiconductor substrate by processing an acid catalyst chemically-amplified positive resist through ordinary photolithography. Next, an organic film containing an acidic component is applied to the pattern, and a resultantly-produced acid is diffused into the resist pattern. The surface layer of the resist pattern (i.e., the residual resist portion) is made soluble in an alkaline developer by means of catalytic action of the acid. Subsequently, the organic film and the solubilized layer are removed by the alkaline developer, thus shrinking the originally-formed resist patterns (i.e., the residual resist portions). As a result, narrow resist patterns can be formed.

More specifically, a fine pattern narrower than the wavelength of exposing light can be stably formed.

Although the foregoing explanation has described a case where the resist pattern is formed on the semiconductor substrate 2, a resist pattern used during manufacture of a semiconductor device is formed not only on a semiconductor substrate but also on a dielectric film, such as a silicon oxide film, or various types of conductive films, such as a polysilicon film or a metallic film. The first embodiment can be applied to formation of a resist film on all types of underlying films such as those mentioned previously. The expression "on a semiconductor substrate" used herein implies a resist film provided on all of these types of films or substrates.

Second Embodiment

FIG. 3 shows a method of manufacturing a semiconductor device according to a second embodiment of the present invention. More specifically, FIG. 3 comprises fragmentary cross-sectional views for explaining steps of a method of forming a fine resist pattern.

In step 1 shown in FIG. 3, a resist pattern 6 is formed on the semiconductor substrate 2 to a line width of 0.25 µm from an acid catalyst chemically-amplified positive resist for use with a KrF laser beam through ordinary photolithography.

In step 2, an organic film 9 which produces an acid upon exposure to light is formed on the semiconductor substrate 2. In other words, a polymer containing an photosensitive acid generator is formed on the semiconductor substrate 2 in the form of a film. For example, the organic film 9 is formed by spin-coating an aqueous solution containing about 1% of naphtoquinonediadido-4-sulfonate-ester-derivatives and polyvinyl pyrrolidone which serves as a base polymer.

In step 3, the organic film 9 is exposed to i-lines of a Hg lamp at a dose of 200 to 1000 mJ/cm$^2$ through use of a photo mask 10 which has a desired pattern and apertures 10a so as to correspond to solely the resist patterns 6 to be shrunk among the resist patterns 6 having a line width of 0.25 µm. As a result of exposure, only the exposed portions of the organic film 9 selectively produce an acidic component.

In step 4, the wafer 1 is subjected to a heat treatment at 60–140° C. for about 1 through 3 minutes by means of a hot plate. As a result, the thus-produced acidic component is diffused into the acid catalyst chemically-amplified positive resist patterns 6 for use with a KrF laser beam (i.e., residual resist patterns), and the surface layer of the resist patterns 6 is made soluble in an alkaline developer by means of action of an acid catalyst, thus forming the solubilized layer 11.

In step 5, the organic film 9 and the solubilized layer 11 are removed by an alkaline developer. More specifically, they are removed from the wafer through use of 2.38 wt. % of tetramethylammoniumhydroxide. In order to eliminate moisture from the resist patterns after removal of the organic film and the solubilized layer, the wafer is subjected to a heat treatment at 100 to 130° C. for about one through three minutes.

As a result, only the resist patterns 6 in contact with the exposed portions of the organic film 9 are shrunk by 0.1 µm. In this way, a resist line pattern 8 of 0.15 µmL/0.35 µmS, which cannot be formed through use of a KrF excimer laser beam by photolithography, can be selectively formed.

In the second embodiment, the polymer of the organic film 9 can be principally formed from a polymer soluble in pure water or in a mixed solution which does not substantially dissolve the resist pattern and consists of pure water and an organic solvent.

More specifically, a polymer which has an acidic component added thereto and is used in the first embodiment or a polymer analogous thereto can be used as the polymer of the organic film 9. In short, the base polymer itself has neutrality. Preferably, for example, the polymer can be selected from the group consisting of polyvinyl alcohol, a polyacrylic acid, polyvinyl pyrrolidone, polyvinyl amine, and polyvinyl acetal.

Preferably, a photosensitive acid generator which differs in photosensitive wavelength from that of an underlying resist pattern is used.

More specifically, for example, the photosensitive acid generator can preferably be selected from the group consisting of onium-salt-based substances, diazobenzene-sulfonic-acid-based substances, diazobenzene-carboxylic-acid-based substances, chrolomethyl-triazine-based substances, and 2,1-naphtoquinonediadido-4-sulfonate-ester-based substances.

More preferably, specific examples of the photosensitive acid generator comprise 4-hydroxy-naphthyl-dimethyl-sulfonium-triphlate (also called as trifluoro-methane-sulfonate), 4,8-dihydroxi-naphtyl-dimethyl-sulfonium-triphlate (also called as trifluoromethane-suflonate), 4,7-dihydroxy-naphthyl-dimethyl-sulfonium-triphlate (also called as trifluoro-methane-sulfonate), 1,8-naphthal-imidile-triphlate (also called as trifluoro-methane-sulfonate), 1,8-naphthal-imidile-tosylate (also called as trien-sulfonate), 1,8-naphthal-imidile-mesylate (also called as methane-suflonate), bis(phenylsulfonyl)diazomethane, bis(4-chlorophenylsulfonyl)diazomethane, bis(2,4-dimethylphenylsulfonyl)diazomethane, 4-methoxy-α-tosyloxy-iminophenyl-acetonitrile, 2,1-naphtoquinonediadizo-4-sulfonate-ester compounds such as pyrogallol ester or gallate ester, or the like.

Preferably, g-lines or i-lines of the Hg lamp or a KrF excimer laser beam can be used as for exposing light.

Preferably, a solution used for forming the organic film 9 can be formed from pure water or a mixed solution which is composed of pure water and an organic solvent to such an extent as not to dissolve the resist pattern, as in the case of the first embodiment.

The coating characteristics of the organic film 9 can be improved, or the diffusion length of an acid in the organic film 9 can be retarded, by addition of an organic base component, such as tetramethylammoniumhydroxide, ethanol amine, or ammonium, to the organic film, as in the case of the first embodiment.

Preferably, the organic base component can be selected from the group consisting of tetramethylammoniumhydroxide, ethanol amine, and ammonium.

The coating characteristics of the organic film 9 can be improved by addition of a surfactant to the organic film 9.

Preferably, an alkaline solution containing 1 to 5 wt. % of tetramethylammoniumhydroxide or this alkaline solution having 10 wt. % or less of alcohol added thereto is used as the alkaline developer, as in the case of the first embodiment.

Next, the mechanism of solubilizing the surface layer of the resist pattern 6 with the alkaline developer by thermally treating the organic film 9 is the same as that explained in the first embodiment, and hence its repeated explanation will be omitted here.

As mentioned previously, according to the second embodiment, a resist pattern is formed on a semiconductor substrate by processing an acid catalyst chemically-amplified positive resist through ordinary photolithography. Next, an organic film which produces an acid on exposure to light, i.e., an organic film containing a photosensitive acid generator, is applied to the pattern, and an acid is produced by exposing the organic film to light. The acid produced by exposure is diffused into the resist pattern. The wafer is subjected to a heat treatment in such a way that the surface layer of the resist pattern (i.e., a residual resist portion) is made soluble in an alkaline developer by means of acid catalytic action of the thus-produced acid. Subsequently, the organic film and the solubilized layer are removed by the alkaline developer, thus shrinking the originally-formed resist patterns (i.e., the residual resist portions).

Further, resist patterns (i.e., residual resist portions) can be selectively shrunk by selectively exposing the resist patterns to light through a photo mask.

Third Embodiment

FIG. 4 shows a method of manufacturing a semiconductor device according to a third embodiment of the present invention. More specifically, FIG. 4 comprises fragmentary cross-sectional views for explaining steps of a method of forming a fine resist pattern.

With reference to FIG. 4, the steps 1 and 2 are the same as those described for the second embodiment, so that their repeated explanations will be omitted.

In step 3, the organic film 9 is exposed to i-lines of the Hg lamp at a dose of 200 to 1000 mJ/cm$^2$ through use of a photo mask 10 which has a desired pattern and apertures 10a so as to correspond to solely the resist patterns 6 to be shrunk among the resist patterns 6 having a line width of 0.25 μm.

In the third embodiment, strip-shaped portions 10a horizontally formed in the center of the photo mask 10 are exposed to light in step 3, and the other strip-shaped portions of the photo mask 10 shield light. As a result of exposure, an acidic component is selectively produced only in the exposed portions of the organic film 9.

In step 4, the wafer is subjected to a heat treatment in the same manner as in the second embodiment, thus forming the solubilized layer 11 along the surface of the resist patterns 6.

In step 5, the organic film 9 and the solubilized layer 11 are removed through use of the alkaline developer, as in the case of the second embodiment.

As a result, line width of the resist pattern 6 (left over portion) is reduced by 0.1 μm at the position contacting the exposed portion of the organic film 9. Thus, resist pattern 12 having a reduced width portion 12a is formed.

In the foregoing second embodiment and third embodiment, the process is common although the mask patterns for light exposure and the resultant resist patterns are different. Therefore, duplicating explanation is not given here.

Now, an explanation will be given of the steps for manufacturing of a semiconductor device in which the resist pattern manufactured by the methods described in one of the first through third embodiments is used.

Figure 5B:
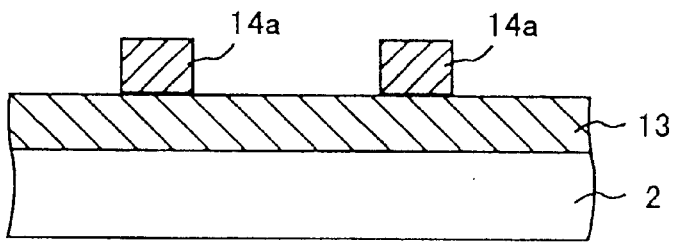

FIG. 5(a) and FIG. 5(b) show a first example of the steps of manufacturing a semiconductor device. As shown in FIG. 5(a), the semiconductor device in the process comprises a dielectric film 13 formed on the semiconductor substrate 2, and a conductive film 14, such as a polysilicon film or an aluminum film, formed on the dielectric film 13. Further, the device comprises resist patterns 8 formed on the conductive film 14 by the method described for the first embodiment.

As shown in FIG. 5(b), a narrow conductive lead pattern 14a narrower than the wavelength of exposing light can be formed by etching the conductive film 14 formed on the wafer 1 by way of the resist patterns 8. For example, an conductive leas pattern having a line width of 0.15 μm can be stably formed.

Figure 6A:
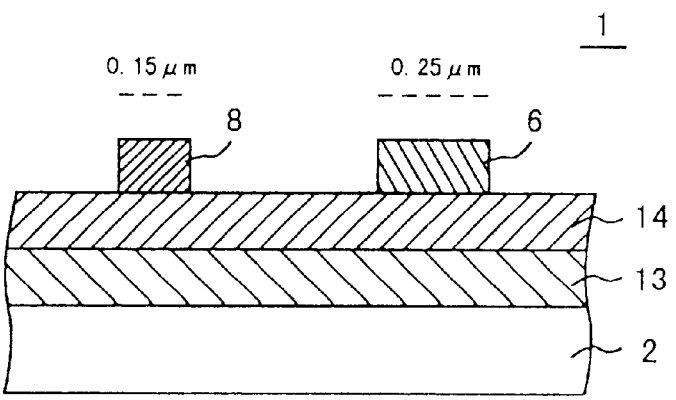
FIGS. 6(a) and 6(b) are schematic representations showing another method of manufacturing a semiconductor device according to the embodiments of the present invention.
Figure 6B:
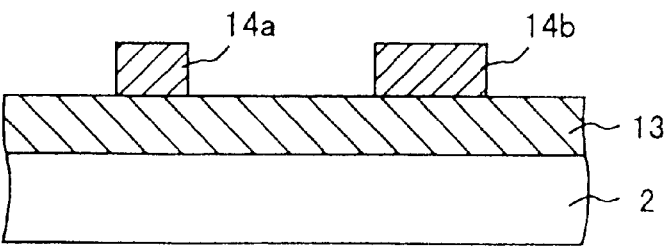

FIG. 6A and FIG. 6(b) show a second example of the steps of manufacturing a semiconductor device. As shown in FIG. 6A, the device in the process comprises the dielectric film 13 formed on the semiconductor substrate 1, and the conductive film 14, such as a polysilicon film or an aluminum film, formed on the dielectric film 13. Further, the device comprises the resist patterns 6 and 8 formed on the conductive film 14 by the method described for the second embodiment.

As shown in FIG. 6(b), for example, the narrow conductive lead pattern 14a whose line width is as narrow as 0.15 μm and a narrow conductive lead pattern 14b having an ordinary line width of 0.25 μm can be formed by etching the conductive film 14 formed on the wafer 1 by way of the resist patterns 6 and 8.

Figure 7A:
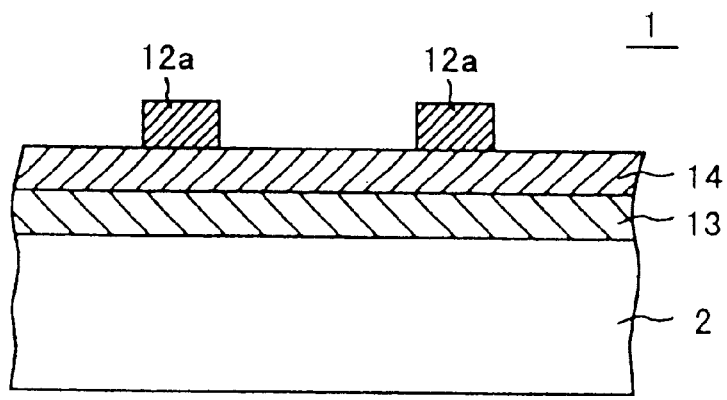
FIGS. 7(a) to 7(c) are schematic representations showing still another method of manufacturing a semiconductor device according to the embodiments of the present invention.
Figure 7B:
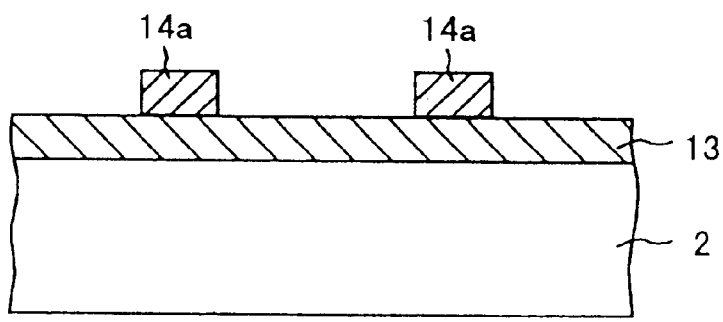

FIG. 7A and FIG. 7(b) show a third example of the steps of manufacturing a semiconductor device. As shown in FIG. 7A, the device in the process comprises the dielectric film 13 formed on the semiconductor substrate 1, and the conductive film 14, such as a polysilicon film or an aluminum film, formed on the dielectric film 13. Further, the device comprises resist patterns 12a formed on the conductive film 14 by the method described for the third embodiment.

Figure 7C:
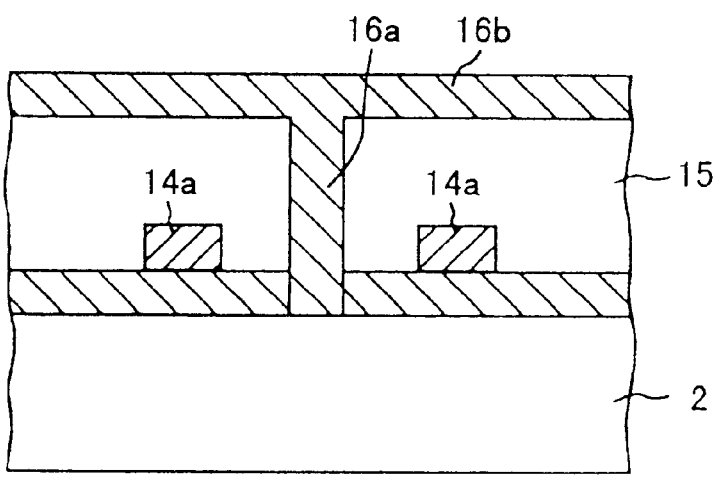

As shown in FIG. 7(b), conductive lead patterns 14a, each having a partially-shrunk portion, can be formed by etching the conductive film 14 by way of the resist patterns 12a. Subsequently, as shown in FIG. 7(c), an interlayer dielectric film 15 is formed, and a conductive plug 16a is vertically formed between two narrow conductive lead patterns 14a and connected to an conductive lead 16b formed on the interlayer dielectric film 15. If this example is applied to semiconductor memory, the conductive lead 14a will work as a word line, and the conductive lead 16b will work as a bit line.

Following the steps as has been described above in FIGS. 5(a) through 7(b), the semiconductor manufacturing steps will continue. However, since these steps are conventional, their explanations will be omitted here.

Thus, a semiconductor device having a fine pattern narrower than the limit of wavelength of exposing light can be manufactured by the foregoing method.

Fourth Embodiment

Figure 8:
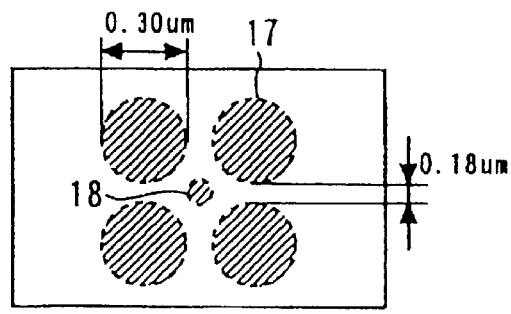
Figure 9:
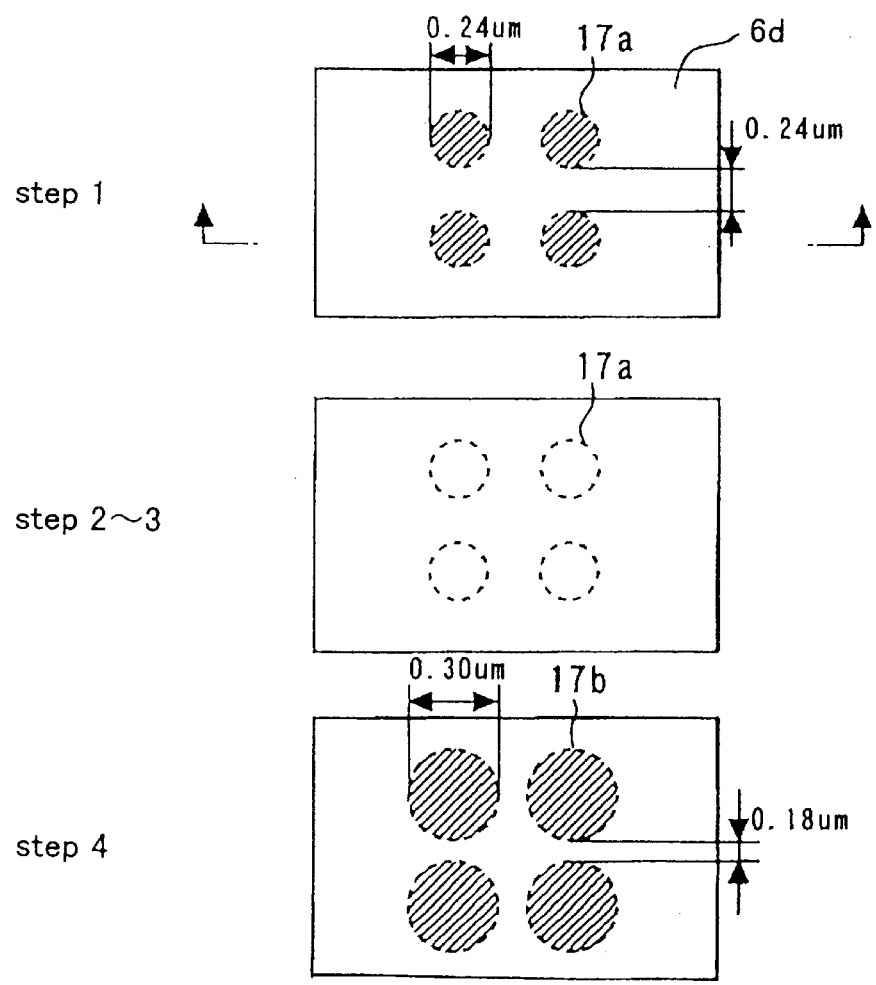

FIGS. 8 through 10 are fragmentary views for describing a semiconductor device manufacturing method according to a fourth embodiment; and more particularly a method of forming a minute resist pattern, as contrasted with the conventional semiconductor device manufacturing method. The present embodiment describes a method of producing a minute resist pattern by processing resist through use of an organic film containing an acidic component, as well as application of the method to preparation of a hole pattern.

FIG. 8 is a plan view showing a resist pattern which has holes and which is prepared, for comparison purposes, through conventional lithography. FIG. 9 shows fragmentary plan views showing individual steps of forming a resist pattern having holes according to a fourth embodiment. FIG. 10 shows cross-sectional views corresponding to FIG. 9.

As shown in FIG. 8, through use of a halftone mask, an array pattern—in which are formed holes 17 having a diameter of 0.30 μm at small pitches, e.g., hole pitches of 0.18 μm,—is prepared by use of a conventional technique. At this time, a dimple 18 is formed by a sub-peak of the halftone mask, so that an unwanted hole is formed in the resist pattern after etching.

In the present embodiment, as indicated in step 1 shown in FIG. 9 and FIG. 10, a resist film 4 is applied on a conductive layer 3, for example, formed on the semiconductor substrate 2. Smaller holes 17a having, for example, a diameter of 0.24 μm, are formed in the resist film 4, thereby forming a hole pattern 6d.

As indicated in step 2 in FIG. 9 and FIG. 10, an organic film 7 containing an acidic component, such as a resin containing polyacrylic acid for example, is applied through spin coating over the wafer 1.

In step 3, acid is diffused over the surface of the hole resist pattern 6d by heating the organic film 7, whereby the surface layer of the hole pattern 6d is solubilized in an alkaline developer. Thus, a solubilized layer 11a is formed on the surface of the hole pattern 6d.

Next, as indicated in step 4, the wafer 1 is developed with the alkaline developer, so that the surface layer of the hole pattern 6d is dissolved and the diameter of the holes 17a is enlarged by 0.06 μm. As a result, there is prepared a resist pattern 8d having holes 17b of 0.30 μm diameter. Further, the hole pitches are diminished by 0.06 μm to pitches of 0.18 μm.

As mentioned above, the small-diameter holes are eventually enlarged, thereby forming a normal hole pattern in which holes are formed at small pitches, which pattern cannot be formed by the conventional technology. The same working effect can be achieved even when a normal mask is used.

The amount of the surface layer being dissolved through development in step 4 is increased by an increase in the temperature of a heat treatment in step 3 and an increase in the time period of the heat treatment, thereby yielding an increase in the amount of shrinkage in hole pitches.

The material of the organic film 7 containing an acidic component, a solution of the material constituting the organic material 7, and an alkaline developer, all of which are used in the first embodiment, can also be applied to the fourth embodiment. Repetition of their explanations is omitted here for brevity.

Fifth Embodiment

Figure 11:
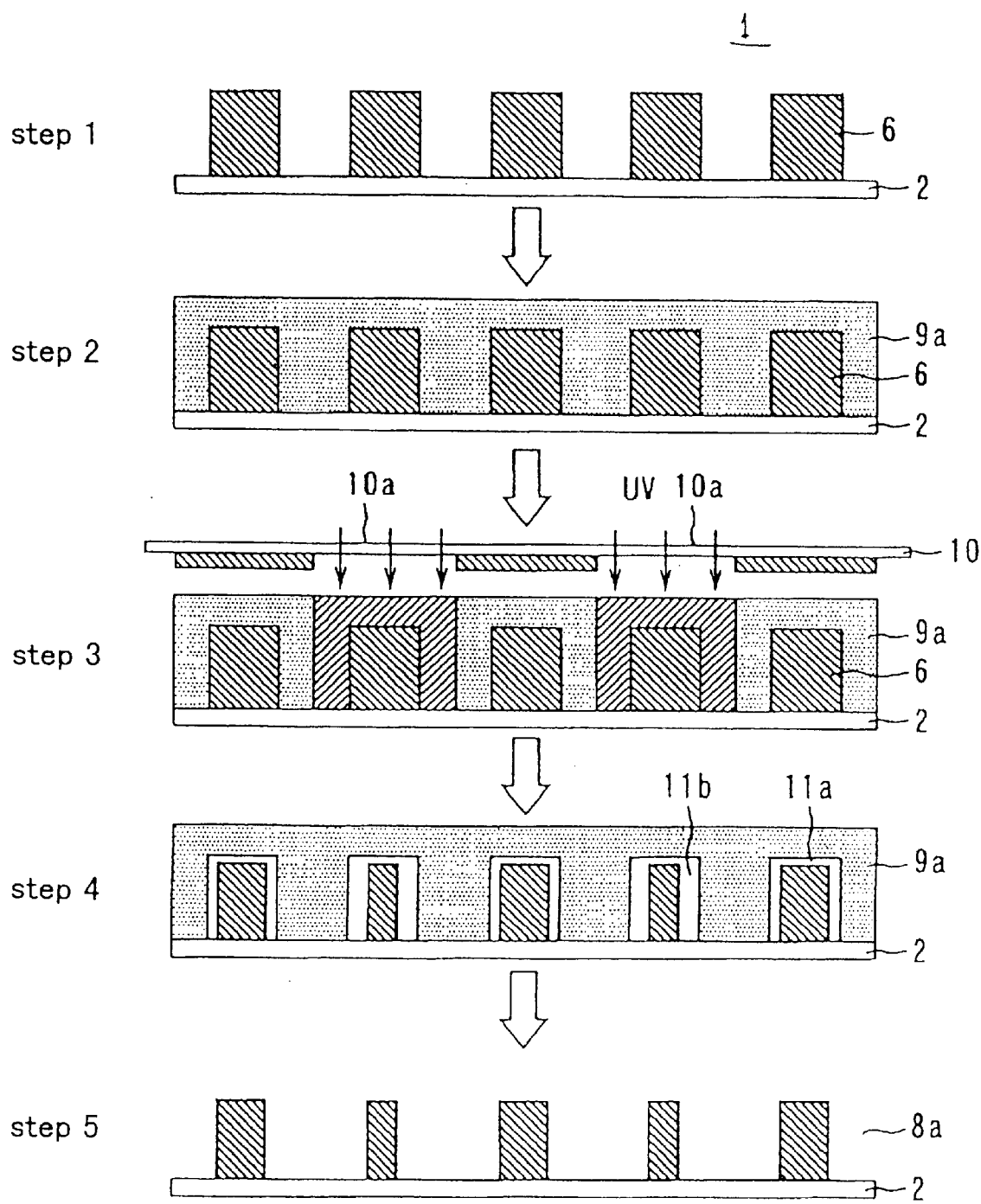
FIG. 11 shows individual steps of the resist pattern forming method adapted in a method of forming a minute resist pattern according to a fifth embodiment of the present invention.

FIG. 11 shows cross-sectional views for describing a semiconductor device manufacturing method according to a fifth embodiment of the present invention; and more specifically, shows individual steps of the resist pattern forming method adapted in a method of forming a minute resist pattern. The present embodiment describes a method of forming a minute resist pattern through processing of resist by use of an acidic organic film containing a photosesitive acid generator.

As in step 1 according to the first embodiment, in step 1 of the process shown in FIG. 11, a resist pattern 6 having a width of 0.25 μm L/S (line and space) is formed through ordinary photolithography on a semiconductor substrate 2 from an acid catalyst chemically-amplified positive photoresist.

In step 2, in place of the organic film containing the photosesitive acid generator used in the second embodiment, an acidic organic film 9a containing a photosesitive acid generator is formed on the semiconductor substrate 2 including the resist pattern 6.

More specifically, the organic film 9a is formed through spin coating of aqueous solution of about 5 wt. % of naphtoquinonediadizo-4-sulfonate-ester-derivatives, about 10 wt. % of perufluoro-alkyl-carboxylic-acid-derivatives, and polyvinyl pyrrolidone serving as a base polymer,.

In steps 3 through 5, processing similar to that relating to steps 3 to 5 in the second embodiment is performed.

Specifically, as in the second embodiment, the organic film 9a that is laid on the resist pattern 6 having a width of 0.25 μm L/S is exposed to i-lines of an Hg lamp at a dose of 200 to 1000 mJ/cm² through use of a photo mask 10 of a desired pattern having openings 10a corresponding to solely the portions of the resist pattern 6 to be narrowed. A hydrochloric acid component is selectively produced in only the thus-exposed portions of the organic film 9a.

In step 4, the wafer 1 undergoes a heat treatment at 60 to 140° C. for about one to three minutes. As a result, the acidic component generated by the light exposure and the acidic component originally contained in the organic film 9a are diffused across the resist pattern 6 (a residual pattern) of acid catalyst chemically-amplified positive photoresist. Thereby, the surface layer of the resist pattern 6 (a resist residue) is made soluble in an alkaline developer through acid-catalyst action of the acidic components, thereby forming a alkaline soluble layer.

At this time, in the unexposed portions of the organic film 9a, only the acidic component originally contained in the organic film 9a is diffused, thereby a thin soluble layer 11a is formed over the surface of the resist pattern 6. On the other hand, in the exposed portions of the organic film 9a, a large amount of acidic component is contained so that a thick soluble layer 11b is created over the surface of the resist pattern 6.

In step 5, the organic film 9a and the soluble layers 11a and 11b are removed by use of an alkaline developer; for example, by a developer containing 2.38 wt. % of tetramethyl-ammonium-hydroxide. Subsequently, the wafer is subjected to a heat treatment at 100 to 130° C. for about one to three minutes in order to eliminate moisture contained in the resist pattern that has undergone exfoliation.

As a result, the resist pattern 6 that is in contact with the exposed portions of the organic film 9a is shrunk by 0.15 μm to a line width of 0.10 μm. In contrast, the resist pattern 6 that is in contact with un-exposed portions of the organic film 9a is shrunk by 0.05 μm to a line width of 0.20 μm. Thus, the amount of shrinkage in line width differs from one line to another, thereby enabling formation of a resist pattern 8a comprising different minute line widths; specifically, 0.10 and 0.20 μm.

Polymer constituting the organic film 9a, a solution constituting the organic film, the photosesitive acid generator, and the alkaline solution, all of which are described in the first and second embodiments, can also be applied to the fifth embodiment. Hence, repetition of their explanations is omitted here for brevity.

As described above, in the fifth embodiment, a resist pattern is first formed on a semiconductor substrate through ordinary photolithography by use of an acid catalyst chemically-amplified positive photoresist. Next, an acidic organic film containing a component capable of generating acid upon exposure; i.e., an acidic organic film containing a photosesitive acid generator, is applied to the resist pattern. The resist pattern is exposed so as to generate acid. The acid originally contained in the organic film and newly-generated acid are diffused across the resist pattern through a heat treatment. Further, the wafer undergoes a heat treatment such that the surface layer of the resist pattern (i.e., resist residue) is solubilized in an alkaline developer by means of acid-catalyst action of the acid. Subsequently, the organic film and the solubilized layer are exfoliated by means of an alkaline developer, thereby selectively narrowing the originally-generated resist pattern (resist residue).

Further, the resist pattern (resist residue) can be selectively narrowed by selective exposure through use of a photo mask.

Sixth Embodiment

A sixth embodiment of the present invention will now be described. The sixth embodiment describes a method of forming a minute resist pattern by processing resist through use of an organic film which includes a photosensitive acid generator and is doped with a photosensitizer.

The sixth embodiment is characterized by addition of a photosensitizer to the organic film which is employed in the second, third, and fifth embodiments.

With regard to the organic film used in the second and third embodiments, a photosensitizer, which will be described later, is added to the organic film 9 in step 2. With regard to the organic film used in the fifth embodiment, a photosensitizer is added to the organic film 9a in step 2.

The photosensitizer is added to the organic film for the purpose of improving sensitivity and plays a role in increasing the amount of acid generated on exposure. Even if the photosesitive acid generator produces no acid by itself upon exposure, acid can be generated by combination of the photosensitizer and the photosesitive acid generator.

The photosensitizer can be selected from the group comprising aromatic hydrocarbon compounds, aromatic nitro compounds, aromatic ketone compounds, aromatic amino compounds, phenol compounds, xinone compounds, anthracene compounds, coumarins, phthalocyanine compounds, porphyrin compounds, acridine compounds, and xanthene compounds.

More specifically, the photosensitizer may be selected from the group comprising: naphthalene, anthracene, phenanthrene, chrysene, nitrobenzene p-dinitrobenzene, 1,3, 5-trinitrobenzene, p-nitro diphenyl, nitroaniline, dinitroanilinepicramide, 2-phloro-4-nitroaniline, phenol, p-nitrophenol, 2,4-dinitrophenol, 2,4,6,-trinitrophenol, benzaldehyde, 9-anthra aldehyde, acetophenone, benzophenone, dibenzoylacetone, benzil, p,p'-diaminobenzophenone, p,p'-dimethylaminobenzophenone, p,p'-tetramethyldiaminobenzophenone, benzoquinone 1,2-naphthoquinone, 1,4-naphthoquinone, anthraquinone, 1,2-benzanthraquinone, anthrone1,9-benzanthraquinone, 6-phenyl-1,9-benzanthraquinone, 3-phenyl-1,9-benzanthraquinone, 2-keto-3-aza-1,9-benzanthraquinone, 3-carbinyl-1,3-diaza-1,9-benzanthraquinone, 2-nitrofluoren, 2,7-dinitrofluorene, 2,5-dinitrofluorene, 1,8-phthaloylnaphthalene, 2-chloro-1,8 -phthaloylnaphthalene, 4-chloro-1,8-phthaloylnaphthalene, 5-nitroacenaphthene, 5,6-dinitroacenaphthene, 5-benzoylacenaphthene, 1-nitropyrene, N-acetyl-4-nitro-1-aminonaphthalene, N-phenylthioacridonetriphenylpyrylium perchlorate, 4-methoxypheny-2,6-diphenylpyrylium perchlorate, 4-buthoxyphenyl-2,6-diphenylpyrylium perchlorate, 4-pentyloxyphenyl-2,6-diphenylpyrylium perchiorate, 2,4, 6-trimethoxyphenyl-2,6-diphenylpyrylium perchlorate, 4-methoxyphenyl-2,6-diphenylthiopyrylium perchlorate, 4-buthoxyphenyl-2,6-diphenylthiopyrylium perchlorate, 4-amiloxyphenyl-2,6-diphenylthiopyrylium perchlorate, 2,4,6-trimethoxyphenyl-2,6-diphenylpyrylium perchlorate, 3-ketocumarin, arylcoumarin, aroylcumarin, carbalkoxybiscumarin, and dialkylketobiscumarin. However, the photosensitizer is not limited to these substances.

These substances may be used alone, or two or more types of these substances may be used in combination.

Desirably, the photosensitizer is added in such an amount as to account for 0.01 to 20 wt. % of a resin composition. In a case where the photosensitizer content of the resin is less than 0.01 wt. %, the photosensitizer has little effect of improving sensitivity. In contrast, when the photosensitizer content of the resin exceeds 20 wt. %, the resultant resin tends to suffer deteriorated stability during storage.

Example

There will now be explained an example relating to effectiveness resulting from addition of photosensitizer to the acid generator.

In place of the organic film 9 employed in step 2 of the second or third embodiment, the following organic film was used for checking the effectiveness of adding a photosensitizer to the acid generator. The organic film was formed through spin coating of an aqueous solution comprising polyvinyl pyrrolidone as a base polymer; 10 wt. % of 4,7-dihydroxy-naphthyl-dimethyl-sulfonium-triflate as a photosesitive acid generator; and further doped with 1 wt. % of 2-ethyl-9,10-dimethoxy-anthracene as a photosensitizer.

The amount of shrinkage in the size of the resist pattern 6 which is in contact with the exposed portions of the organic film was 0.05 µm for the resist pattern without doping with photosensitizer and 0.1 µm for the resist pattern doped with photosensitizer. An increase in the amount of acid resulting from addition of photosensitizer could be ascertained.

Seventh Embodiment

Figure 12:
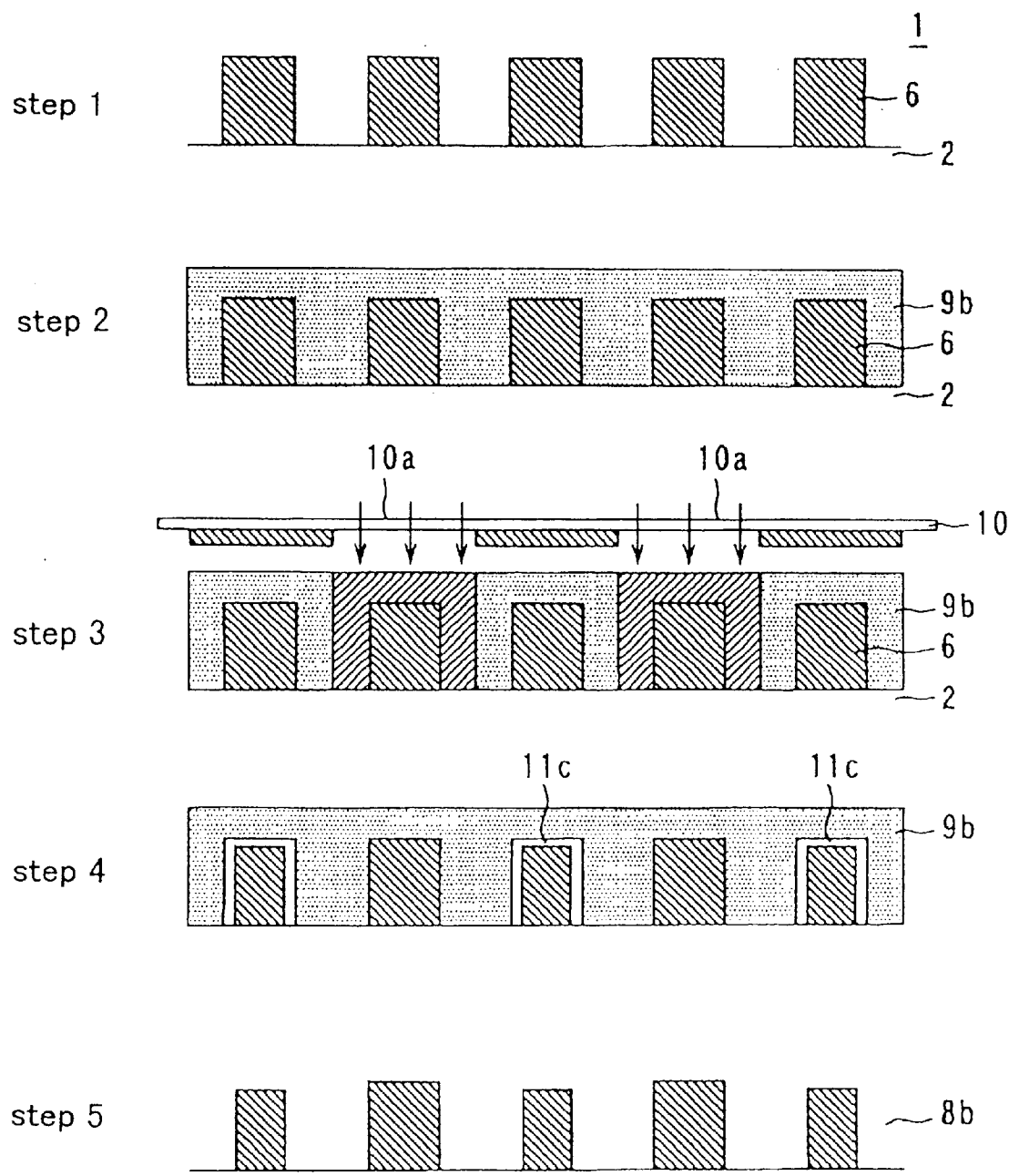
FIG. 12 shows individual steps of the resist pattern forming method adapted in a method of forming a minute resist pattern according to a seventh embodiment of the present invention.

FIG. 12 shows cross-sectional views for describing a semiconductor device manufacturing method according to a seventh embodiment of the present invention; and more specifically, shows individual steps of the resist pattern forming method for forming a minute resist pattern. This embodiment describes a method of forming a minute resist pattern through processing of resist by use of an acidic organic film containing a base generator.

As in step 1 according to the second embodiment, in step 1 shown in FIG. 12, a resist pattern 6 having a width of 0.25 µm L/S is formed through ordinary photolithography on a semiconductor substrate 2 by use of an acid catalyst chemically-amplified positive photoresist.

In step 2, in place of the organic film containing the photosesitive acid generator used in the second embodiment, an acidic organic film 9b which generates a basic component upon exposure is formed on the semiconductor substrate 2 including the resist pattern 6. In other words, a film is formed on the semiconductor substrate 2 from a polymeric film containing a base generator. The agent for generating a basic component will be described in detail later.

In steps 3 through 5, processing similar to that relating to steps 3 to 5 in the second embodiment is performed.

Specifically, the organic film 9b that is laid on the resist pattern 6 having a width of 0.25 µm L/S is exposed to i-lines of an Hg lamp at a dose of 200 to 1000 mJ/cm$^2$, through use of a photo mask 10 of a desired pattern having openings 10a corresponding to solely the portions of the resist pattern 6 to be narrowed. A basic component 5 is selectively produced in only the thus-exposed portions of the organic film 9b.

In the present embodiment, a basic component is selectively generated in the exposed portions of the organic film 9b, whereby the basic component neutralizes an acidic component contained beforehand in the organic film 9b. Accordingly, no acidic component diffuses across the resist pattern 6. In contrast, in the un-exposed portions of the organic film 9b, no basic component is produced and the acidic component still remains in those portions of the organic film 9b.

In step 4, the wafer 1 undergoes a heat treatment at 60 to 140° C. for about one to three minutes. As a result, the residual acidic component in the organic film 9b is diffused across the resist pattern 6 (a residual pattern) of acid catalyst chemically-amplified positive photoresist. Thereby, the surface layer of the resist pattern 6 (a resist residue) is made soluble in an alkaline developer through acid-catalyst action of the acidic components, and an anlaline-soluble layer 11c is formed.

In step 5, the organic film 9b and the solubilized layer 11c are removed by use of an alkaline developer. As a result, only the resist pattern (resist residue) 6 that is in contact with the unexposed portions of the organic film 9b is shrunk by 0.1 µm to a line width of 0.15 µm, thereby enabling formation of a resist pattern 8b comprising different minute line widths.

The diffusion length of an acid can be selectively controlled by addition of a transition metal complex, a benzyl-carbamate compound, or an oxime compound to the acidic organic film 9b.

Polymer constituting the organic film 9b, the solution constituting the organic film, and the alkaline solution, all of which are described in the first and second embodiments, can also be applied to the seventh embodiment. Hence, repetition of their explanations is omitted here for brevity.

The base generator designates a substance which generates a base in response to an external stimulus. Here, an external stimulus designates active actinic radiation such as ultraviolet radiation or electron radiation; heating action; or exposure to an appropriate gas or fluid. Among these stimuli, ultraviolet radiation and heating action are preferable.

Desirably, any of known compounds which generate a base upon exposure to ultraviolet radiation or heat can be used. The base generator may be selected from the group comprising transition metal complexes, benzyl-carbamate compounds, and oxime compounds. Further, the resultant base can be either an organic or inorganic base.

In terms of the efficiency of generating a base upon exposure to ultraviolet radiation and the dissolution of a base into the solution of an organic film (a supernatant), an organic amine group is a particularly preferable base. The organic amine group to be produced may be either an aliphatic amine or an aromatic amine. Further, the organic amine group may be monofunctional or multifunctional.

More specifically, a base generator which generates such an organic amine group is selected from the group comprising ammonia, methylamine, ethylamine, propylamine, n-butylamine, hexylamine, cyclohexylamine, decylamine, cesiramine, hydrazine, tetramethylenediamine, hexamethylenediamine, benzylamine, aniline, naphthylamine, phenylenediamine, toluenediamine, diaminodiphenylmethane, hexamethyltetramine, piperidine, and piperazine. However, the base generator is not limited to these substances. Further, these base generators which generate an organic amine group may be used solely, or two or more of the base generators may be used in combination.

Further, the base generator may be selected from the group comprising hexaammoniacobalt perchlorate, hexapropylamminecobalt perchlorate, hexacarbinylaminecobalt perchlorate, bromopentapropylaminecobalt perchlorate, bromopentaammoniacobalt perchlorate, bromopentamethylaminecobalt perchlorate, [[(2-nitrobenzyl)oxy]carbonyl]methylamine, [[(2-nitrobenzyl)oxy]carbonyl]ethylamine, [[(2-nitrobenzyl)oxy]carbonyl]propylamine, [[(2-nitrobenzyl)oxy]carbonyl]hexylamine, [[(2-nitrobenzyl)oxy]Carbonyl]cyclohexylamine, [[(2-nitrobenzyl)oxy]carbonyl]aniline, [[(2-nitrobenzyl)oxy]carbonyl]piperidine, bis[[(2-nitrobenzyl)oxy]carbonyl]hexamethylenediamine, bis[[(2-nitrobenzyl)oxy]carbonyl]phenylenediamine, bis [[(2-nitrobenzyl)oxy]carbonyl]hexamethylenediamine, bis [[(2-nitrobenzyl)oxy]carbonyl]toluenediamine, bis[[(2-nitrobenzyl)oxy]carbonyl]diaminodiphenylmethane, bis [[(2-nitrobenzyl)oxy]carbonyl]piperazine, [[(2,6-dinitrobenzyl)oxy]carbonyl]ethamine, [[(2,6-dinitrobenzyl)oxy]carbonyl]propylamine, [[(2,6-dinitrobenzyl)oxy]carbonyl]hexylamine, [[(2,6-dinitrobenzyl)oxy]carbonyl]cyclohexylamine, [[(2,6-dinitrobenzyl)oxy]carbonyl]aniline, [[(2,6-dinitrobenzyl)oxy]carbonyl]piperidine, bis [[(2,6-dinitrobenzyl)oxy]carbonyl]hexamethylenediamine, bis[[(2,6-dinitrobenzyl)oxy]carbonyl]phenylenediamine, bis[[(2,6-dinitrobenzyl)oxy]carbonyl] hexamethylenediamine, bis[[(2,6-dinitrobenzyl)oxy]carbonyl]toluenediamine, bis[[(2,6-dinitrobenzyl)oxy]carbonyl]diaminodiphenylmethane, bis[[(2,6-dinitrobenzyl)oxy]carbonyl]piperazine, [[(alpha,alpha-dimethyl-3,5-dimethoxybenzyl)oxy]carbonyl]methylamine, [[(alpha, alphadimethyl-3,5-dimethoxybenzyl)oxy]carbonyl]ethylamine, [[(alpha,alpha-dimethyl-3,5 -dimethoxybenzyl)oxy]carbonyl]propylamine, [[(alpha,alpha-dimethyl-3,5-dimethoxybenzyl)oxy]lcarbonyl]hexylamine, [[ (alpha, alpha-dimethyl-3,5-dimethoxybenzyl)oxy]carbonyl] cyclohexylamine, [[(alpha,alpha-dimethyl-3,5-dimethoxybenzyl)oxy]carbonyl]aniline, [[(α,α-dimethyl-3, 5-dimethoxybenzyl)oxy]carbonyl]piperidine, bis[[(α,α-dimethyl-3,5-dimethoxybenzyl)oxy]carbonyl] hexamethylenediamine, bis[[(α,α-dimethyl-3,5-dimethoxybenzyl)oxy]carbonyl]phenylenediamine, bis[[(α, α-dimethyl-3,5-dimethoxybenzyl)oxy]carbonyl] diaminodiphenylmethane, bis[[(α,α-dimethyl-3,5-dimethoxybenzyl)oxy]carbonyl]toluenediamine, bis[[(α,α-dimethyl-3,5-dimethoxybenzyl)oxy]carbonyl]piperazine, propionylacetophenone oxime, propionylbenzophenone oxime, propionylacetone oxime, butyrylacetonephenon oxime, butyrylbenzophenone oxime, butyrylacetone oxime, adipoylacetophenone oxime, adipoylbenzophenone oxime, adipooylacetone oxime, acroylacetophenone oxime, acroylbenzophenone oxime, and acroylacetone oxime. However, the base generator is not limited to these substances.

These base generators may be used along, or two or more of these base generators may be used in combination.

Preferably, the base generator is added in such an amount as account for 0.01 to 50 wt. % of a resin composition. In a case where the base generator content is less than 0.01 wt. %, the base generator has little effect of dissolving the surface layer of the resist pattern by means of an alkaline developer. In contrast, when the base generator content exceeds 50 wt. %, the resultant resin tends to suffer deteriorated stability during storage.

As described above, in -the seventh embodiment, a resist pattern is first formed through ordinary photolithography on a semiconductor substrate from acid catalyst chemically-amplifiedpositive photoresist. Next, an acidic organic film containing a base generator capable of generating a basic component upon exposure to external stimulus such as radiation is applied to the resist pattern. The resist pattern is exposed so as to generate a basic component, whereby the basic component neutralizes acid. The wafer is subjected to heat treatment such that acid still remaining in unexposed regions of the resist pattern is diffused to the resist pattern, and such that the surface layer of the resist pattern (i.e., resist residue) is solubilized in an alkaline developer by acid-catalyst action of the diffused acid. Subsequently, the organic film and the solubilized layer are exfoliated by the alkaline developer, thereby narrowing the originally-generated resist pattern (i.e., resist residue).

Further, the resist pattern (resist residue) can be selectively narrowed by selective exposure through use of a photo mask.

As mentioned above, use of the photosesitive base generator enables selective generation of a base and retardation of diffusion of acid, thereby selectively shrinking a wiring pattern.

Eighth Embodiment

An eighth embodiment of the present invention will now be described. The present embodiment describes a method of forming a minute resist pattern by processing resist through use of an organic film which includes a photosesitive base generator and is doped with a photosensitizer.

The eighth embodiment is characterized by addition of a photosensitizer to the organic film employed in the seventh embodiment.

The photosensitizer is added to the organic film for the purpose of improving sensitivity and plays a role in increasing the base content. Specifically, if the photosesitive base generator itself produces no base upon exposure, base can be generated by combination of the photosensitizer and the photosesitive base generator.

The substances that have been described for the purpose of improving the sensitivity of the acid generator in connection with the sixth embodiment can also be used as photosensitizers in the present embodiment for improving sensitivity of the base generator. However, the photosensitizer is not limited to these substances. The photosensitizers may be used solely, or two or more of the photosensitizers may be used in combination.

Desirably, the photosensitizer is added in such an amount as to account for 0.01 to 20 wt. % of a resin composition. In a case where the photosensitizer content is less than 0.01 wt. %, the photosensitizer has little effect of improving sensitivity. In contrast, when the photosensitizer content exceeds 20 wt. %, the resultant resin tends to suffer deteriorated stability during storage.

Example

There will now be explained an example relating to effectiveness resulting from addition of photosensitizer to the base generator.

In place of the organic film 9b employed in step 2 of the seventh embodiment, the following organic film was used for checking the effectiveness resulting from addition of a photosensitizer to the base generator. The organic film was formed through spin coating of an aqueous solution comprising polyvinyl pyrrolidone as a base polymer; 5 wt. % of bis [[(2-nitrobenzyl)oxy]carbonyl]hexamethylenediamine as a photosesitive base generator; and further doped with 2 wt. % of 2-carboxyl-9,10-dimethoxy-anthracene as a photosensitizer.

As a result, the amount of shrinkage of the resist pattern 6 which is in contact with the exposed portions of the organic film was 0 μm for the resist pattern without doping of photosensitizer, and 0.07 μm for the resist pattern doped with photosensitizer. An increase in the amount of base resulting from addition of photosensitizer could be ascertained.

Ninth Embodiment

A ninth embodiment of the present invention will now be described. The present embodiment describes a method of forming a minute resist pattern by processing resist through use of an organic film (a basic organic film) containing a basic component.

In the ninth embodiment, an organic film containing a basic component; i.e., a basic organic film, is used in lieu of the organic film 7 that contains an acidic component and is employed in the first embodiment.

In the present embodiment, the basic component contained in the organic film is diffused into the resist pattern of acid catalyst chemically-amplified positive photoresist (i.e., a residual pattern) through heating. The surface layer of the resist pattern (i.e., resist residue) is solubilized in the alkaline developer by means of acid-catalyst action of the basic component, thereby forming a solubilized layer. The organic film and the thus-formed solubilized layer are removed by the alkaline developer.

Consequently, the solubilized layer on the surface of the resist pattern is dissolved and the width of the resist pattern is shrunk.

Other specific processes are similar to those employed in other embodiments or can be inferred by analogy, and hence their detailed explanations are omitted here.

A mechanism for diffusing a basic component into a resist pattern and for solubilizing the surface layer of the resist pattern in an alkaline developer differs from that employed in the case which has been described with reference to FIG. 2, in which the surface layer is solubilized by use of the acidic component. In the case where the surface layer is solubilized by use of a basic component, the surface of the resist pattern containing a basic component is dissolved by means of an alkaline developer. Even in the case where such a different mechanism is employed, the same advantageous results are yielded.

In the present embodiment, a basic polymer may be used as an organic film containing a basic component. In short, the organic film itself corresponds to a basic base polymer.

The basic organic film or a preferred example of basic polymer may comprise polyvinyl pyrrolidone, polyethyleneimine, polyacrylimide, or polyvinylamine; a compound of two or more of theses; or a salt thereof. The basic organic film is not limited to these substances. Any substance may be used as a basic organic film, so long as the substance is a basic polymer or oligomer capable of being uniformly applied over a substrate.

Further, polymer doped with a basic component may also be used as an organic film containing a basic component. In other words, base polymer, which itself is neutral, is doped with a basic component.

Preferably, the base polymer is selected from the group comprising polyvinyl alcohol, polyacrylic acid, polyvinyl pyrrolidone, polyvinylamine, and polyvinyl acetal.

Preferably, a basic component added to such a polymer is selected from the group comprising an amino compound, an imino compound, hydroxide, pyridine base, and their salts.

For instance, the basic component can be selected from the group comprising tetramethylammonium hydroxide, ethanolamine, triethylamine, ammonia, methylamine, ethylamine, propylamine, n-butylamine, hexylamine, cyclohexylamine, decyl amine, cesiramine, hydrazine, tetramethylenediamine, hexamethylenediamine, benzylamine, aniline, naphthylamine, phenylenediamine, toluenediamine, Diaminodiphenylmethane, hexamethyltetramine, piperidine, and piperazine. However, the basic component is not limited to these substances. Any substance may be employed as the basic component, so long as the substance is dissolved in a solvent which does not dissolve the resist pattern.

The material of the organic film, the solution constituting the organic film, and the alkaline developer, all of which are used in the first embodiment, can be applied to the present embodiment. Hence, repetition of their explanations is omitted here for brevity.

As described above, in the ninth embodiment, a resist pattern is first formed through ordinary photolithography on a semiconductor substrate from acidcatalyst chemically-amplifiedpositive photoresist. Next, an organic film containing a basic component is applied to the resist pattern, and the basic component is diffused into the resist pattern through heating. The surface layerof the resist pattern (i.e., resist residue) is solubilized in the alkaline developer by means of the acid-catalyst action of the basic component. Subsequently, the organic film and the solubilized layer are exfoliated by the alkaline developer, thereby narrowing the originally-formed resist pattern (i.e., resist residue) and enabling formation of a narrow resist pattern.

As a result, a minute pattern whose line width is smaller than the wavelength of radiation to which the pattern is to be exposed can be stably formed.

Tenth Embodiment

A tenth embodiment of the present invention will now be described. The present embodiment describes a method of forming a minute resist pattern by processing resist through use of an organic film containing a photosensitive base generator.

In the tenth embodiment, an organic film containing a base generator is used in lieu of the organic film 9 that contains an acid generator and is employed in the second or third embodiment.

The base generator described in connection with the seventh embodiment can also be used in the present embodiment.

Further, the organic films employed in the first and ninth embodiment can be used in the present embodiment.

Other specific processes are similar to those employed in other embodiments or can be inferred by analogy, and hence their detailed explanations are omitted here.

As described above, in the tenth embodiment, a resist pattern is first formed through ordinary photolithography on a semiconductor substrate fromacidcatalyst chemically-amplifiedpositivephotoresist. Next, an organic film which generates a base upon exposure; i.e., an organic film containing a photosesitive base generator, is applied to the resist pattern, and a base is generated by exposing the substrate to radiation. The wafer is subjected to a heat treatment such that the base is diffused into the resist pattern and that the surface layer of the resist pattern (i.e., resist residue) is solubilized in the alkaline developer by means of the acid-catalyst action of the basic component. Subsequently, the organic film and the solubilized layer are exfoliated by the alkaline developer, thereby narrowing the originally-formed resist pattern (i.e., resist residue).

Further, the resist pattern (resist residue) can be selectively narrowed by selective exposure through use of a photo mask.

Eleventh Embodiment

An eleventh embodiment of the present invention will now be described. The present embodiment describes a method of forming a minute resist pattern by processing resist through use of a basic organic film containing a photosensitive base generator.

In the present embodiment, a basic organic film containing a base generator is used in lieu of the organic film 9a that contains an acid generator and is employed in the fifth embodiment.

Figure 13:
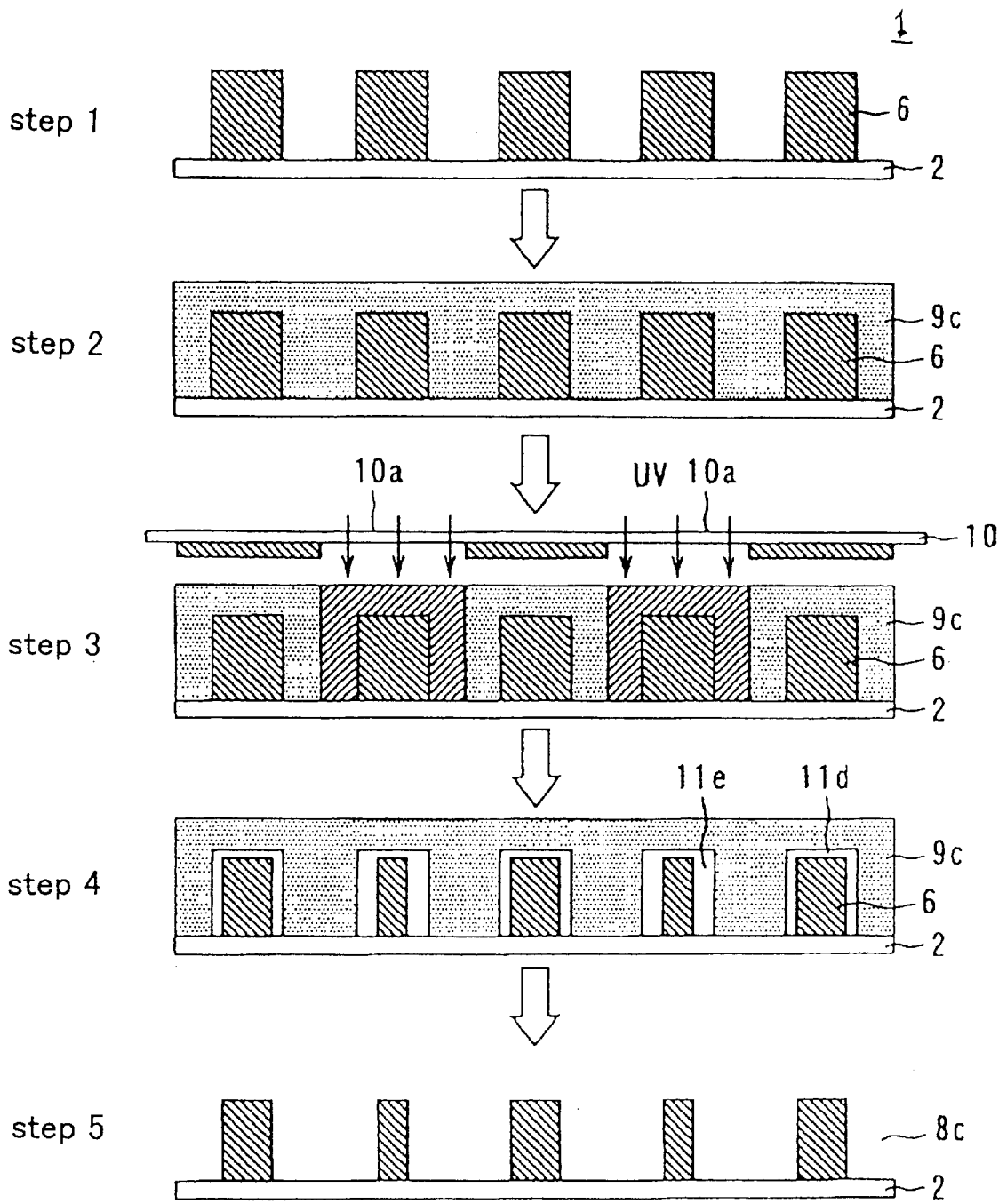
FIG. 13 shows individual steps of the resist pattern forming method adapted in a method of forming a minute resist pattern according to a eleventh embodiment of the present invention.
Figure 14:
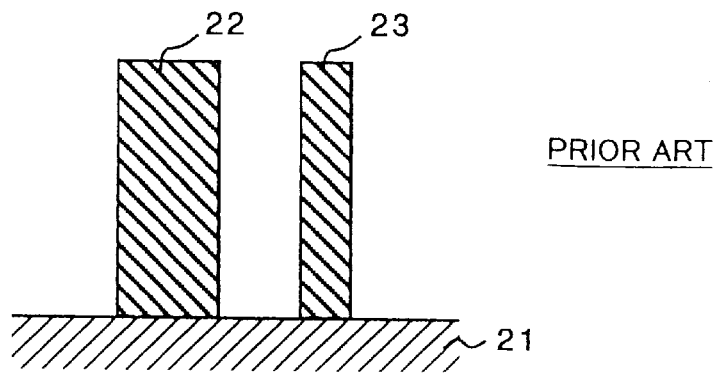
FIG. 14 is a schematic representation showing resist patterns formed according to a conventional method by exposing an underlying layer to light while a mask of a stepper is held in optimum focus.
Figure 15:
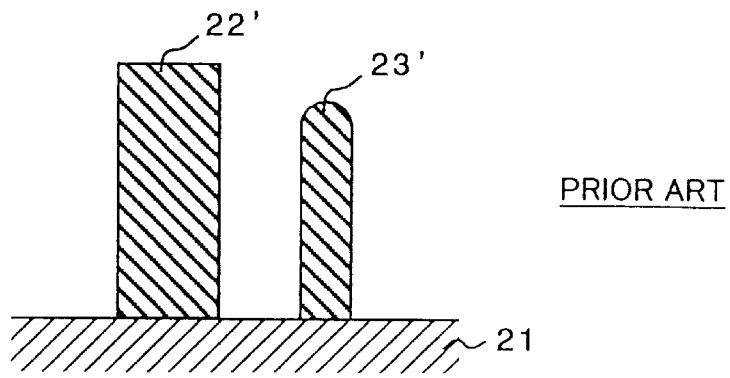
FIG. 15 is a schematic representation showing resist patterns formed according to a conventional method by exposing the underlying layer to light while the mask of the stepper is held out of focus.
Figure 16:
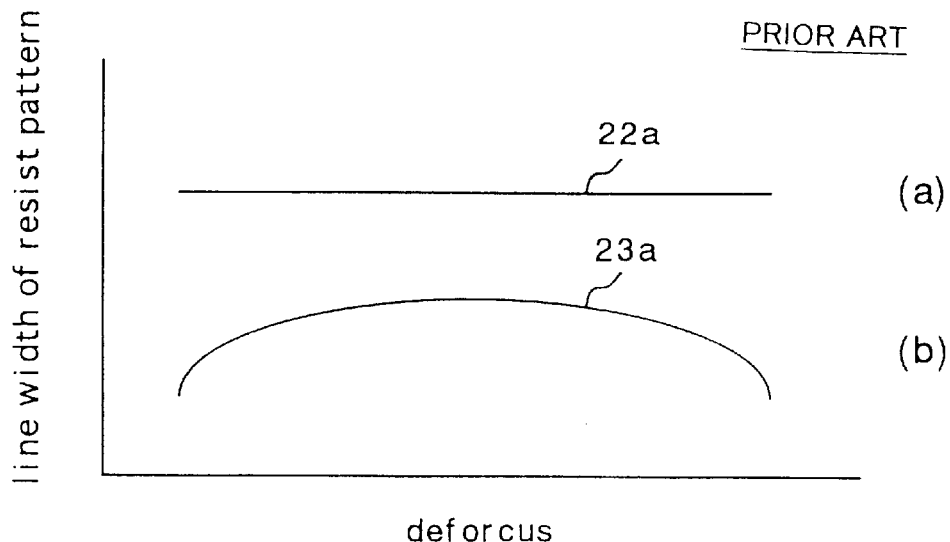
FIG. 16 is a plot showing the relationship between the dimension of the resist pattern and defocus of the stepper.

FIG. 13 shows cross-sectional views for describing a semiconductor device manufacturing method according to the eleventh embodiment of the present invention; and more specifically, shows individual steps of the resist pattern forming method for forming a minute resist pattern.

As in step 1 according to the first embodiment, in step 1 shown in FIG. 13, a resist pattern 6 having a width of 0.25 µm L/S is formed through ordinary photolithography on the semiconductor substrate 2 from an acid catalyst chemically-amplified positive photoresist.

In place of the organic film that contains a photosesitive acid generator and is employed in the second embodiment or the acidic organic film that contains a photosesitive acid generator and is employed in the fifth embodiment, a basicorganic film 9c containing a photosensitive base generator is formed in step 2 on the semiconductor substrate 2 containing the resist pattern 6.

More specifically, the organic film 9c is formed through spin coating of an aqueous solution of about 3 wt. % of bis[[(2-nitrobenzyl)oxy]carbonyl]cyclohexylamine, about 10 wt. % of tetramethyl-ammonium-hydroxide, and polyvinyl pyrrolidone as a base polymer.

In steps 3 through 5, processing similar to that relating to steps 3 to 5 in the second embodiment is performed.

Specifically in step 3, as in the second embodiment, the organic film 9c that is laid on the resist pattern 6 having a width of 0.25 µm L/S is exposed to i-lines of an Hg lamp at a dose of 200 to 1000 mJ/cm$^2$, through use of a photo mask 10 of a desired pattern having openings 10a corresponding to solely the portions of the resist pattern 6 to be narrowed. A basic component is selectively produced in only the thus-exposed portions of the organic film 9c.

In step 4, the wafer 1 undergoes a heat treatment at 60 to 140° C. for about one to three minutes. As a result, the basic component generated by light exposure and the basic component originally contained in the organic film 9c are diffused across the resist pattern 6 (a residual pattern) of acid catalyst chemically-amplified positive photoresist. Thereby, the surface layer of the resist pattern 6 (resist residue) is made solubile in an alkaline developer through acid-catalyst action of the basic components, and a solubilized layer is formed.

At this time, in the un-exposed portions of the organic film 9c, only the basic component originally contained in the organic film 9c is diffused, and a thin solubilized layer 11d is formed over the surface of the resist pattern 6. On the othrer hand, in the exposed-portions of the organic film 9c, a large amount of basic component is diffused, and a thick solubilized layer 11e can be formed over the surface of the resist pattern 6.

In step 5, the organic film 9c and the solubilized layers 11d and 11e are removed by use of an alkaline developer; for example, by a developer of 2.38 wt. % of tetramethyl-ammonium-hydroxide. Subsequently, the wafer is subjected to a heat treatment at 100 to 130° C. for about one to three minutes in order to eliminate moisture contained in the resist pattern that has undergone exfoliation.

As a result, the resist pattern 6 that is in contact with the exposed portions of the organic film 9c is shrunk by 0.15 µm to a line width of 0.10 µm. In contrast, the resist pattern 6 that is in contact with un-exposed portions of the organic film 9c is shrunk by 0.05 µm to a line width of 0.20 µm. Thus, the amount of shrinkage in line width differs from one line to another, thereby enabling formation of a resist pattern 8c comprising different minute line widths; specifically, 0.10 and 0.20 µm.

Polymer constituting the organic film 9, the solution constituting the organic film, the photosesitive base generator, and the alkaline solution, all of which are described in the first, second, seventh, and eighth embodiments, can also be applied to the eleventh embodiment. Hence, repetition of their explanations is omitted here for brevity.

As described above, in the eleventh embodiment, a resist pattern is first formed through ordinary photolithography on a semiconductor substrate from acid catalyst chemically-amplified positive photoresist. Next, an acidic organic film containing a component capable of generating abase upon exposure; i.e., an acidic organic film containing a photosesitive base generator, is applied to the resist pattern. The resist pattern is exposed so as to generate a base. The base originally contained in the organic film and the newly-generated base are diffused across the resist pattern through a heat treatment. Further, the wafer undergoes a heat treatment such that the surface layer of the resist pattern (i.e., resist residue) is solubilized in an alkaline developer by means of acid-catalyst action of the acid. Subsequently, the organic film and the solubilized layer are exfoliated by means of an alkaline developer, thereby selectively narrowing the originally-generated resist pattern (resist residue).

Further, the resist pattern (resist residue) can be selectively narrowed by selective exposure through use of a photo mask.

Twelfth Embodiment

A twelfth embodiment of the present invention will now be described. The present embodiment describes a method of forming a minute resist pattern by processing resist through use of a basic organic film containing a photosensitive acid generator.

In the twelfth embodiment, a basic organic film containing an acid generator is used in lieu of the acidic organic film 7 that contains an acidic component and is employed in the seventh embodiment.

Other specific processes are similar to those employed in other embodiments or can be inferred by analogy, and hence their detailed explanations are omitted here.

As described above, in the twelfth embodiment, a resist pattern is first formed through ordinary photolithography on a semiconductor substrate fromacidcatalyst chemically-amplifiedpositive photoresist. Next, a basic organic film containing an acid generator capable of generating an acidic component upon exposure to an external stimulus such as radiation is applied to the resist pattern. The resist pattern is exposed so as to generate an acidic component, whereby the basic component neutralizes acid. The wafer is subjected to heat treatment such that base still remaining in unexposed regions of the resist pattern is diffused to the resist pattern through a heat treatment, and such that the surface layer of the resist pattern (i.e., resist residue) is solubilized in an alkaline developer by acid-catalyst action of the diffused base. Subsequently, the organic film and the solubilized layer are exfoliated by the alkaline developer, thereby narrowing the originally-generated resist pattern (i.e., resist residue).

Further, the resist pattern (resist residue) can be selectively narrowed by selective exposure through use of a photo mask.

As mentioned above, employment of the photosesitive acid generator enables selective generation of acid and retardation of diffusion of base, thereby selectively shrinking a wiring pattern.

In the above, the individual embodiments have been described. However, not always provided are the every minor detail of the requirements, such as the material of the organic film used in the embodiments, the solution constituting the organic film, the acid generator, the base generator, the acidic component, the basic component, and the alkaline developer. The requirements for one embodiment may be applied across the other individual embodiments or can be used within the scope of the present invention.

For instance, the photosensitizer described in connection with the six or eighth embodiment can also be applied to other subsequent embodiments. Repetition of its explanation is omitted here.

In the third embodiment, an explanation is given for the process of manufacturing a semiconductor device through use of resist pattern described in conjunction with the first through third embodiments. This explanation can also be applied to use of the resist patterns formed in all the subsequent embodiments.

In any event, within the scope of the present invention, each description or explanation to a specific embodiment may be applied to other embodiments each other.

Now, the effects and advantages of the present invention may be summarized as follows.

According to the present invention, a fine resist pattern narrower than the limit of wavelength of exposing light can be stably formed by processing a resist through the chemical mechanism of diffusion of an acid or decomposition of a resist.

Further, through use of the thus-formed resist pattern, a fine pattern narrower than the limit of wavelength of exposing light can be stably formed, whether or not the pattern is a conductive film or a dielectric film, enabling manufacturing of a semiconductor device having such a fine pattern.

Further, a fine pattern can be selectively formed by exposing a wafer to light through a desirable photo mask.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 10-56686, filed on Mar. 9, 1998 and a Japanese Patent Application No. 10-130052, filed on May 13, 1998 including specification, claims, drawings and summary, on which the Convention priority of the present application is based, are incorporated herein by reference in its entirety.

Further, the entire disclosure of a Japanese Patent Application No. 11-062047, filed on Mar. 9, 1999 including specification, claims, drawings and summary are incorporated herein by reference in its entirety.

What is claimed is:

1. A method of manufacturing a semiconductor device comprising the steps of:

forming a resist pattern on a semiconductor underlying layer disposed on a semiconductor substrate through use of an acid catalyst chemically-amplified photoresist;

forming an organic film containing an acidic component or a base component on the surface of said semiconductor underlying layer including said resist pattern;

thermally-treating said organic film to diffuse said acidic component or base component thereby rendering the surface layer of said resist pattern soluble in an alkaline developer; and removing said thermally-treated organic film and said surface layer of said resist pattern through use of said alkaline developer thereby reducing said resist pattern.

2. The semiconductor device manufacturing method according to claim 1, wherein an acidic polymer is used as said organic film containing said acidic component.

3. The semiconductor device manufacturing method according to claim 1, wherein a polymer having an acidic component added thereto is used as said organic film containing said acidic component.

4. The semiconductor device manufacturing method according to claim 1, wherein a basic polymer is used as the organic film containing said basic component.

5. The semiconductor device manufacturing method according to claim 1, wherein a polymer having a basic component added thereto is used as said organic film containing said basic component.

6. The semiconductor device manufacturing method according to claim 1, wherein an alkaline solution containing 1 to 5 wt. % of tetramethylammoniumhydroxide or this alkaline solution having 10 wt. % or less of alcohol added thereto is used as said alkaline developer.

7. The semiconductor device manufacturing method according to claim 1, wherein said organic film is principally formed from a polymer soluble in pure water or in a mixed solution which does not substantially dissolve said resist pattern and comprised of pure water and an organic solvent.

8. A method of manufacturing a semiconductor device comprising the steps of:

forming a resist pattern on a semiconductor underlying layer disposed on a semiconductor substrate through use of an acid catalyst chemically-amplified photoresist;

forming an organic film on the surface of said semiconductor underlying layer including said resist pattern, said organic film producing an acid or a base on exposure to light;

exposing said organic film to light to produce an acid or a base therein;

thermally-treating said organic film to diffuse said acid or base thereby rendering the surface layer of said resist pattern soluble in an alkaline developer; and removing said organic film and said surface layer of said resist pattern through use of the alkaline developer thereby reducing said resist pattern.

9. The semiconductor device manufacturing method according to claim 8, wherein said organic film is selectively exposed to light through a photo mask.

10. The semiconductor device manufacturing method according to claim 8, wherein said organic film is principally formed of a polymer soluble either in pure water or in a mixed solution which consists of pure water and an organic solvent and which does not substantially dissolve said resist pattern.

11. The semiconductor device manufacturing method according to claim 8, wherein said organic film which generates an acid on exposure to light is formed by addition of a photosensitive acid generator to a polymer.

12. The semiconductor device manufacturing method according to claim 11, wherein said photosensitive acid generator has a photosensitive wavelength differing from that of said resist pattern.

13. The semiconductor device manufacturing method according to claim 8, wherein said organic film which generates a base on exposure to light is formed by addition of a photosensitive base generator to a polymer.

14. The semiconductor device manufacturing method according to claim 13, wherein said photosensitive base generator has a photosensitive wavelength differing from that of said resist pattern.

15. The semiconductor device manufacturing method according to claim 8, wherein a photosensitizer is added to said organic film.

16. The semiconductor device manufacturing method according to claim 8, wherein an alkaline solution containing 1 to 5 wt. % of tetramethylammoniumhydroxide or this alkaline solution having 10 wt. % or less of alcohol added thereto is used as said alkaline developer.

17. The semiconductor device manufacturing method according to claim 8, wherein said organic film is principally formed from a polymer soluble in pure water or in a mixed solution which does not substantially dissolve said resist pattern and comprised of pure water and an organic solvent.

* * * * *